United States Patent [19]

Hisano et al.

[11] Patent Number: 5,198,889
[45] Date of Patent: Mar. 30, 1993

[54] COOLING APPARATUS

[75] Inventors: Katsumi Hisano; Tomiya Sasaki; Masaru Ishizuka, all of Kanagawa, Japan

[73] Assignee: Kabushiki Kaisha Toshiba, Kawasaki, Japan

[21] Appl. No.: 723,303

[22] Filed: Jun. 28, 1991

[30] Foreign Application Priority Data

Jun. 30, 1990 [JP] Japan .................................. 2-173342
Mar. 18, 1991 [JP] Japan .................................. 3-052294

[51] Int. Cl.$^5$ .................... H01L 25/04; H01L 23/46; H01L 23/42
[52] U.S. Cl. .................... 257/678; 361/382; 361/385; 257/712; 257/714; 257/715; 257/717; 257/722; 257/730
[58] Field of Search .................... 357/81, 82; 361/382, 361/385

[56] References Cited

U.S. PATENT DOCUMENTS

| | | | |
|---|---|---|---|
| 3,586,101 | 6/1971 | Chu | 357/82 |
| 3,942,586 | 3/1976 | Fries | 357/82 |
| 4,027,728 | 6/1977 | Kobayashi et al. | 357/82 |
| 4,103,737 | 8/1978 | Perkins | 357/82 |
| 4,145,708 | 3/1979 | Ferro et al. | 357/82 |
| 4,882,654 | 11/1989 | Nelson et al. | 361/382 |
| 4,884,169 | 11/1989 | Cutchaw | 357/82 |
| 4,910,642 | 3/1990 | Downing | 361/385 |
| 4,928,207 | 5/1990 | Chrysler et al. | 361/385 |
| 4,949,164 | 8/1990 | Ohashi et al. | 357/82 |
| 4,966,226 | 10/1990 | Hamburger | 361/385 |
| 4,996,589 | 2/1991 | Kajiwara et al. | 357/82 |
| 5,019,880 | 5/1991 | Higgins, III | 357/82 |
| 5,023,695 | 6/1991 | Umezawa et al. | 357/82 |
| 5,046,552 | 9/1991 | Tousignant | 357/82 |
| 5,077,601 | 12/1991 | Hatada et al. | 357/82 |

FOREIGN PATENT DOCUMENTS

| | | |
|---|---|---|
| 56-23764 | 6/1981 | Japan . |
| 57-96557 | 6/1982 | Japan . |
| 57-133654 | 8/1982 | Japan . |
| 59-94859 | 5/1984 | Japan . |
| 59-217346 | 12/1984 | Japan . |
| 60-72252 | 4/1985 | Japan . |
| 0209630 | 1/1987 | Japan . |
| 1-17457 | 1/1989 | Japan . |
| 1-19754 | 1/1989 | Japan . |
| 2-130948 | 5/1990 | Japan . |

OTHER PUBLICATIONS

Japanese Patent Publication; Japan Heat Transfer Symposium, Jun. 25, 1988; S. Yoshikawa et al; "A Method of seepage cooling by using water as a coolant".
Japanese Patent Publication; Japan Heat Transfer Symposium, Jun. 17, 1990; S. Yoshikawa et al; "Research of seepage cooling".

*Primary Examiner*—Eugene R. LaRoche
*Assistant Examiner*—Viet Q. Nguyen
*Attorney, Agent, or Firm*—Oblon, Spivak, McClelland, Maier & Neustadt

[57] ABSTRACT

A cooling apparatus for cooling a heat generating member by removing heat produced in the member comprises a cooling stud which is thermally jointed to the heat generating member, a woking fluid for removing the heat transmitted to the cooling stud by utilizing vaporization thereof, a condenser for condensing the vaporized fluid and providing the liquid phase fluid to the cooling stud, and a passage through which the liquid phase fluid passes while vaporizing to remove the heat, the liquid phase fluid being provided to the passage in the cooling stud by the condenser device.

15 Claims, 23 Drawing Sheets

COOLING APPARATUS

BACKGROUND OF THE INVENTION

1. Field of the Invention

The present invention relates to a cooling apparatus, and, in particular, to a cooling apparatus for cooling a semiconductor chip or the like.

2. Description of the Prior Art

Because a heat generating member of a semiconductor chip produces heat during operation the semiconductor chip is cooled by means of a cooling apparatus to maintain a uniform performance.

Conventionally, various types of cooling devices such as those illustrated in FIG. 1 to FIG. 5 are used for cooling a semiconductor chip.

A cooling apparatus for cooling a semiconductor chip shown in FIG. 1 comprises a fin assembly 101 mounted on the upper part of a semiconductor chip 102. A plurality of semiconductor chips 102 is illustrated, each chip attached to a substrate 103. Then, a fluid such as air or the like is caused to flow, by means of a fan 105, through a vessel 104 in which are housed the semiconductor chips 102, bearing the fin assemblies 101, and the substrates 103, to dissipate the heat from the semiconductor chips 102 into the air.

However, with this type of cooling apparatus which cools by the airflow from the fan 105 through the fins 101 mounted on the semiconductor chip 102, when the semiconductor chips are mounted at a high density on the substrate 103, as in contemporary chips, because of the considerable increase in the amount of heat radiated from all the semiconductor chips combined, the problem arises that it is not possible to efficiently cool the semiconductor chips 102 with uniform temperature distribution.

With the cooling apparatus for cooling a semiconductor chip shown in FIG. 2, a plurality of semiconductor chips 111 (three in the drawing) attached to a substrate 112 are positioned within a space 115 formed between a base 113, which bears the substrate 112 on its inner side, and a heat transmitting block 114.

A cooling stud 116 is inserted into a space opened by a hole 114a and contacts the upper portion of the semiconductor chip 111 inside the hole 114a which is formed in the heat transmitting block 114. The cooling stud 116 presses against the semiconductor chip 111 from the action of a string 117 installed in the hole 114a. Also, a channel 118, in which a coolant flows, is formed in the heat transmitting block 114. Helium gas is filled into the space 115 formed between the base 113 and the heat transmitting block 114.

With the conventional types of cooling apparatus described above, the heat produced by the semiconductor chip 111 is transmitted to the cooling stud 116, and is also transmitted to the heat transmitting block 114 through the helium gas. Then, the semiconductor chip 111 is cooled by the cooling of the heat transmitting block 114 from the coolant flowing in the channel 118.

However, with the above-mentioned conventional cooling apparatus, because of poor precision of assembly, in the case where the cooling stud 116 contacts the upper portion of the semiconductor chip 111 at an angle, considerable heat resistance is produced at the point of contact so that the cooling effect is diminished, and, in addition, the heat in the semiconductor chip 111 encounters a large amount of heat resistance in transmitting heat to the heat transmitting block 114 by heat conduction from a gas such as helium.

In the cooling apparatus for cooling a semiconductor chip shown in FIG. 3, a heat transmitting block 122 is thermally connected to the surface of a semiconductor chip 121. On the side of the heat transmitting block 122 opposite to the semiconductor chip 121, a plurality of channels 124 is formed from a plurality of fins 123 arranged linearly (each fin 123 having a cross section of from several tens to several hundreds $\mu$m square) (see FIG. 4). The fins 123 are formed by an etching process.

The fins 123 on the heat transmitting block 122 are enclosed by a cover plate 125. A feed port 126 is provided on one end of the cover plate 125 and a discharge port 127 on the other for circulating the coolant through the channels 124.

With the above-mentioned conventional cooling apparatus, when heat is produced by the semiconductor chip 121, this heat is transmitted to the fins 123 of the heat transmitting block 122. Then, the fins 123 of the heat transmitting block 122 are cooled by the coolant flowing in the channels 124, thus cooling the semiconductor chip 121.

However, because the fins 123 are formed linearly between the feed port 126 and the discharge port 127 in the above-mentioned conventional cooling apparatus, the heat transfer coefficient of the fins 123 drops, and, in addition, the channel resistance of the channel 124 formed by the fins 123 is large, so that the efficiency of the cooling of the semiconductor chip 121 is reduced.

In the cooling apparatus for cooling a semiconductor chip shown in FIG. 5, a plurality of semiconductor chips 131 (three in the drawing) are attached to a substrate 132, and on the reverse surface of the substrate 132 (the surface opposite the side on which the semiconductor chip is attached in the drawing), a cap 136 for sealing in a working fluid 135 is integrally joined to a pipe section 134, forming a heat pipe. A plurality of fins 133 is attached to the outside of the pipe section 134.

With the above-mentioned conventional cooling apparatus, when heat is produced by the semiconductor chip 131, this heat passes through the substrate 132 and is transmitted to the working fluid 135 contained by the cap 136, thus heating the working fluid 135. The heated working fluid 135 rises inside the pipe section 134 and after the heat is removed by radiation from the fins 133, is liquefied and returns to the cap 136.

However, with the above-mentioned conventional cooling apparatus, when the coefficient of thermal conductivity of the substrate 132 is poor, the problem arises that the heat resistance is large and the heat in the semiconductor chip 131 cannot be effectively transmitted into the working fluid 135 in the cap 136. Therefore, the efficiency of the cooling of the semiconductor chip 121 is reduced.

As outlined above, in the types of cooling apparatus for cooling a semiconductor chip shown in FIG. 1 to FIG. 5, when the semiconductor chips are mounted at a high density and when large amounts of heat are contained, as in contemporary chips, good cooling is not possible.

SUMMARY OF THE INVENTION

An object of the present invention is to provide, with due consideration to the drawbacks of such conventional apparatus, a cooling apparatus with reduced heat resistance which can adequately cool a heat generating member of a semiconductor chip.

This object is achieved in a first invention by the provision of a cooling apparatus comprising a cooling apparatus for cooling a heat generating member by removing heat produced in the member, comprising:

a cooling stud which is thermally jointed to the heat generating member;

a working fluid for removing the heat transmitted to the cooling stud by utilizing vaporization thereof;

a fluid supplier for providing the liquid phase working fluid to the cooling stud; and a passage through which the working fluid passes while vaporizing to remove the heat, the liquid phase working fluid being provided to the passage in the cooling stud by the fluid supplier.

In the above configuration, by providing the working fluid to the cooling stud to which the heat is transmitted from the heat generating member, when the working fluid is vaporized in the passage the heat is removed from the cooling stud because the working fluid requires the heat to vaporize.

Accordingly, the heat is removed from the cooling stud by not only the convection of the working fluid but also the vaporization of the working fluid. In normal, the heat transfer coefficient of the vaporization is enormously larger than that of the convection. Therefore, the cooling apparatus according to the present invention can reduce heat resistance and adequately cool the heat generating member.

It is preferable that the cooling stud be a porous material and the passage be pores formed into the porous material.

In the above configuration, the working fluid provided into the cooling stud easily permeates the cooling stud. Therefore, the heat transmitting area is not only the surface of the cooling stud but also the all surface of the pores.

Accordingly, the heat can be more rapidly removed from the heat generating member through the cooling stud.

It is preferable that the passage be penetrating holes through which the liquid phase working fluid passes from the inside of the cooling stud to the outside.

In the above configuration, the working fluid provided into the cooling stud passes to the outside of the stud through the penetrating holes. Therefore, the heat exchange is also carried out in the cooling stud.

Accordingly, the heat can easily removed from the heat generating member through the cooling stud.

It is preferable that the cooling stud be a porous material with fins and the passage be pores formed into the porous material.

In the above configuration, the heat of the cooling stud is removed from the surface of the fins. Because each fin has a large heat transmitting area, the heat is removed from the cooling stud by the extended heat transmitting area.

Accordingly, the heat can easily removed from the heat generating member through the cooling stud as comparing with no fin stud.

It is preferable that the passage be narrow wicks digged on the surface of the cooling stud and the working fluid be poured on the surface of the cooling stud.

In the above configuration, the working fluid poured on the surface of the cooling stud is provided over the entire periphery of the cooling stud because the working fluid flows along the narrow wicks.

Accordingly, the heat removal can be reliably carried out on the periphery of the cooling stud.

It is preferable that the cooling stud be a thin plate-shaped porous metal and the working fluid be poured on the surface of the cooling stud.

In the above configuration, the heat is removed in a narrow space because the cooling stud is thin.

Accordingly, the heat can be efficiently removed.

The object is further achieved by the provision of a cooling apparatus for cooling a heat generating member by removing heat produced in the member, comprising:

a cooling stud which is thermally jointed to the heat generating member;

a coolant for removing the heat transmitted to the cooling stud by convection cooling;

a coolant supplier for supplying the coolant to the cooling stud;

a flexible sheet for isolating the coolant from the heat generating member;

a sheet pressing member for pressing the sheet against the cooling stud; and a supplementary member for furthering the isolation of the flexible sheet by supplementing the sheet pressing member.

In the above configuration, the coolant provided to the cooling stud is isolated from the heat generating member by the flexible sheet. Therefore, there is no adverse effect in the operation of the heat generating member. In the conventional art, the only sheet pressing member is provided to achieve the isolation of the sheet.

However, the sheet pressing member is not enough to isolate the coolant from the heat generating member. In the present invention, the supplementary member furthers the isolation of the flexible sheet.

Accordingly, the coolant can be reliably isolated from the heat generating member.

The object is further achieved by the provision of a cooling apparatus for cooling a heat generating member by removing heat produced in the member, comprising:

a cooling stud which is thermally jointed to the heat generating member;

a coolant for removing the heat transmitted to the cooling stud by forced convection cooling;

a flexible sheet for isolating the coolant from the heat generating member; and a coolant supplier for supplying the pressurized coolant to the cooling stud, the cooling stud being pressed against the heat generating member by the pressure of the coolant.

In the above configuration, the cooling stud is pressed against the heat generating member. Therefore, the heat resistance between the cooling stud and the heat generating member is small even if no spring is provided.

Accordingly, the cooling apparatus can be easily made up.

The object is further achieved by the provision of a cooling apparatus for cooling a heat generating member by removing heat produced in the member, comprising:

a cooling stud which is thermally jointed to the heat generating member;

a coolant for removing the heat transmitted to the cooling stud by forced convection cooling;

a coolant supplier for supplying the coolant to the cooling stud; and an agitator for furthering the removal of the heat by stirring the coolant.

In the above configuration, the agitator stirs the coolant so that the flow is changed to the turbulent flow. Therefore, the removal of the heat is furthered.

Accordingly, the heat can quickly removed from the heat generating member through the cooling stud.

The object is further achieved by the provision of a cooling apparatus for cooling a heat generating member by removing heat produced in the member, comprising:

a working fluid for absorbing the heat produced in the member and vaporizing;

a heat transmitting sheet for transmitting the heat produced in the member to the working fluid;

a fluid holder for holding the working fluid, the fluid absorbing the heat through the heat transmitting sheet;

a pipe section in which the fluid vaporized in the fluid holder rises; and a heat dissipation section for dissipating the heat held in the vaporized fluid which rises in the pipe section, the vaporized fluid being condensed by dissipating its heat in the heat dissipation section.

In the above configuration, the vaporized fluid which has absorbed the heat is condensed in the heat dissipation section and dropped into the fluid holder. In general, the heat transfer coefficient is enormously large when the working fluid is condensed.

Accordingly, the heat is reliably removed in the same manner as the principle of the heat pipe.

The object is further achieved by the provision of a cooling apparatus for cooling a heat generating member by removing heat produced in the member, comprising:

a working fluid for absorbing the heat produced in the member and vaporizing;

a fluid holder for holding the working fluid; and a fin-tube heat exchanger for removing the heat of the fluid which has vaporized in the fluid holder to absorb the heat produced in the heat generating member.

In the above configuration, the cooling apparatus according to the present invention is provided the fin-tube heat exchanger. Therefore, the removal of the heat is furthered as compared with no fin tube type.

Accordingly, the heat is further reliably removed.

The object is further achieved by the provision of a cooling apparatus for cooling a heat generating member by removing heat produced in the member, comprising:

a working fluid for absorbing the heat produced in the member and vaporizing;

a fluid holder for holding the working fluid;

a first fin-tube heat exchanger for removing the heat of the fluid which has vaporized in the fluid holder to absorb the heat produced in the heat generating member; and a second fin-tube heat exchanger for removing the heat of the fluid which has held in liquid phase in the fluid holder.

In the above configuration, the heat of the liquid fluid is removed at the bottom side, while the heat of the vaporized fluid is removed at the upper side.

Accordingly, good cooling can be obtained with almost uniform temperature distribution by the heat exchanger with the fin-equipped pipe.

The object is further achieved by the provision of a cooling apparatus for cooling a heat generating member by removing heat produced in the member, comprising:

a heat transmitting block which is thermally jointed to the heat generating member;

a group of heat dissipation fins which is provided on the peripheral surface of the heat transmitting block, the fins being formed in a staggered arrangement; and a coolant for removing the heat transmitted to the heat transmitting block, the coolant flowing among the heat dissipation fins.

In the above configuration, the coolant flows among heat dissipation fins formed in the staggered arrangement while being removed the heat by the heat dissipation fins.

Accordingly, the number of fins can be kept small by the staggered arrangement of the fins. Also, the resistance of the fins to the flow of the coolant can be reduced.

DETAILED DESCRIPTION OF THE PREFERRED EMBODIMENTS

Other features of this invention will become apparent in the course of the following description of exemplary embodiments which are given for illustration of the invention and are not intended to be limiting thereof.

First Embodiment

Figure 1:
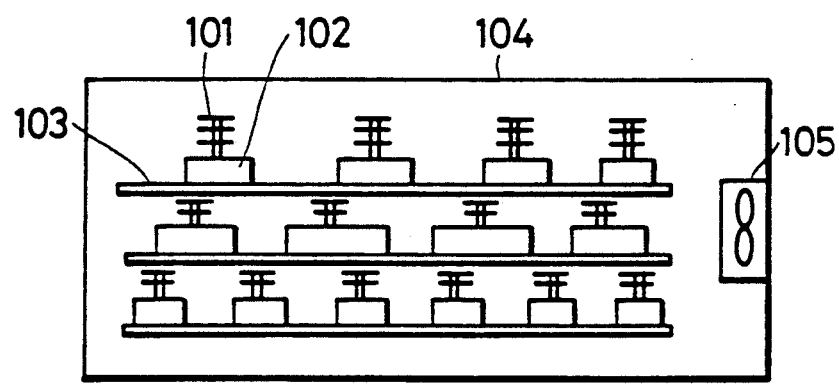
FIG. 1 is a schematic view showing a first conventional cooling apparatus.
Figure 2:
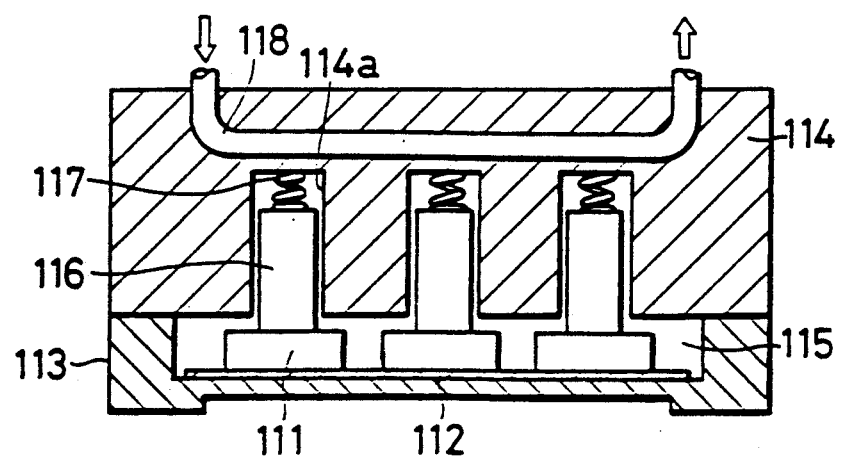
FIG. 2 is a schematic sectional view showing a second conventional cooling apparatus.
Figure 3:
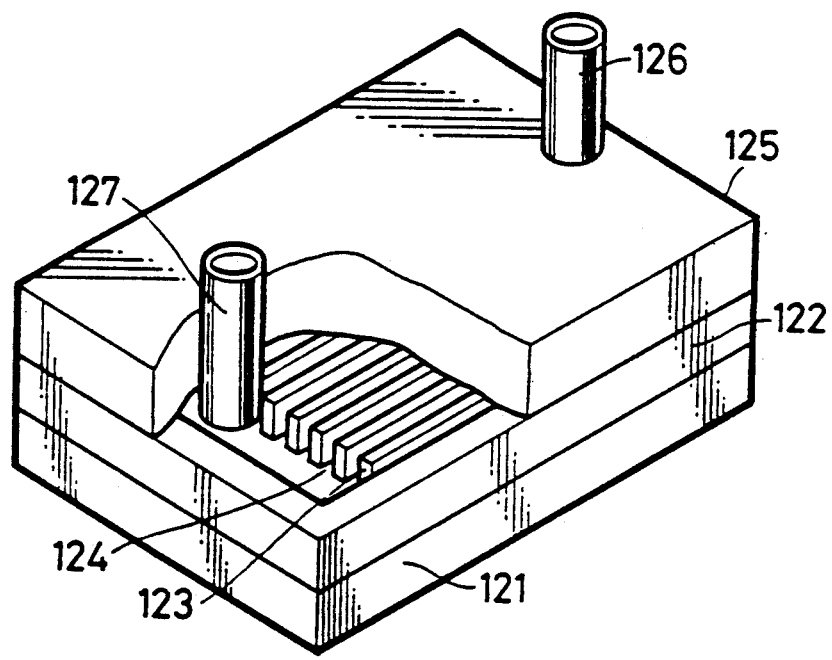
FIG. 3 is a partial sectional diagonal view showing a third conventional cooling apparatus.
Figure 4:
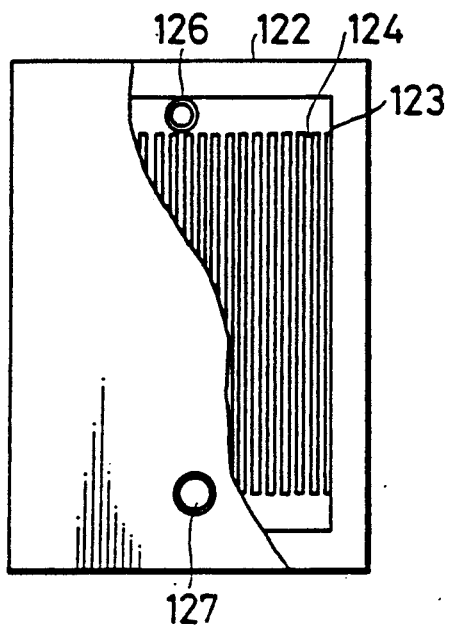
FIG. 4 is a partial sectional plan view of the cooling apparatus shown in FIG. 3.
Figure 5:
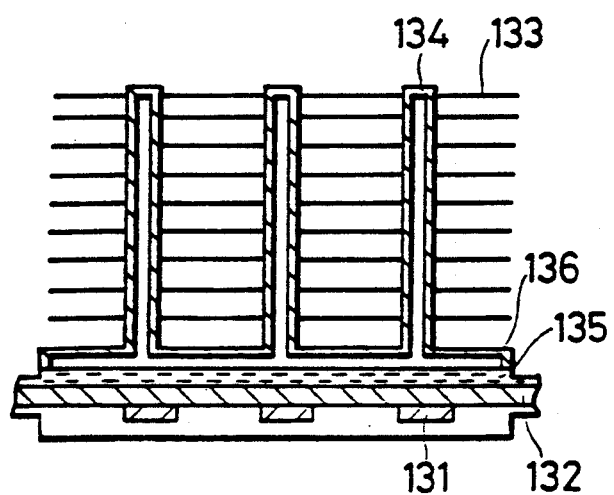
FIG. 5 is a schematic sectional view showing a fourth conventional cooling apparatus.
Figure 6:
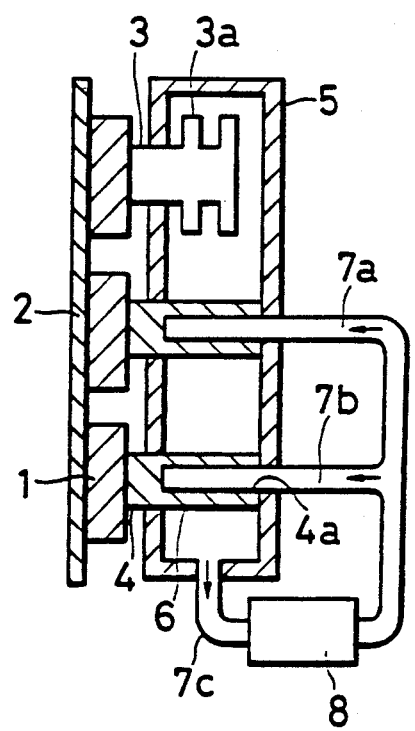
FIG. 6 is a schematic sectional view showing a cooling apparatus which relates to a first embodiment of the present invention.

Now referring to the drawings, FIG. 6 is a schematic sectional view showing a cooling apparatus which relates to a first embodiment of the present invention. As shown in the drawing, a plurality of semiconductor chips 1 (three in the drawing) are attached longitudinally to a substrate 2, for example, through a bump or bonding wire (omitted from the drawings), and a pair of cooling studs 3, 4 are thermally joined to the upper surface of each semiconductor chip 1.

The cooling studs 3, 4 are set and sealed inside a vessel 5, so that the end of the cooling stud 4 contacts the inner surface of the vessel 5. The part of the cooling stud 4 positioned in the vessel 5 is formed from a porous material 6 (for example, a porous metal), and a hole 4a is formed inside this part. Examples of the porous material 6 which can be given are a sintered metal or a foamed metal of copper or nickel or the like.

A pair of pipes 7a, 7b are respectively connected into the holes 4a formed in the cooling studs 4. The pipes 7a, 7b are connected to pipe 7c which is connected to a condenser 8, and the other end of the pipe 7c communicates with the inside of the vessel 5. A working fluid (for example, an alternative to Freon, such as a fluorocarbon) is circulated through the pipes 7a, 7b, 7c and through the porous material 6 of the cooling stud 4. A fin 3a is also integrally formed with the cooling stud 3.

Because the cooling apparatus of the present embodiment has the configuration outlined above, when heat is generated in the semiconductor chip 1, this heat is transmitted to the cooling studs 3, 4 which are joined to the semiconductor chips 1.

Figure 7:
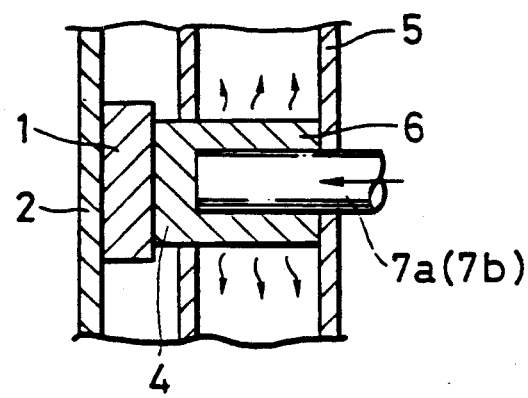
FIG. 7 is a partial sectional view of the cooling apparatus shown in FIG. 6.

At this time, a working fluid, such as, for example, a fluorocarbon as a Freon alternative, which is liquified and cooled by the condenser 8, is introduced into the porous material 6 of the cooling stud 4 through the pipes 7a, 7b, and this working fluid flows out into the vessel 5 through the porous material 6, as shown in FIG. 7. When the liquefied and cooled working fluid passes through the porous material 6, this working fluid is vaporized and removes the heat from the cooling stud 4, thus effectively cooling the semiconductor chip 1. In addition, the working fluid which flows from the porous material 6 of the cooling stud 4 into the vessel 5 is vaporized. The vapor then flows through the pipe 7c and once again is introduced into the condenser 8, where it is liquefied by cooling. The heat transmitted into the cooling stud 3 is radiated from the fin 3a through the working fluid cooled by adiabatic expansion in the vessel 5.

Second embodiment

Figure 8:
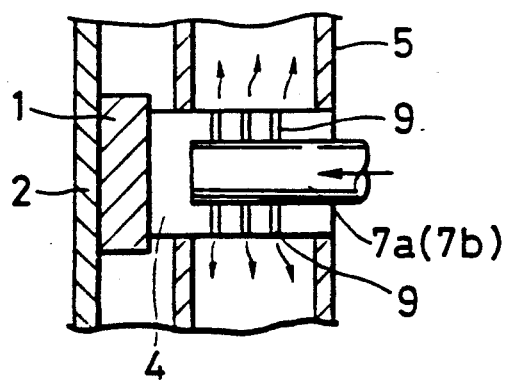
FIG. 8 is a schematic sectional view showing the principal parts of a cooling apparatus which relates to a second embodiment of the present invention.

FIG. 8 is a schematic sectional view showing the principal parts of a cooling apparatus which relates to a second embodiment of the present invention. In this embodiment, in place of the porous material 6 of the cooling stud 4 used in the first embodiment shown in FIG. 6, 7, a plurality of small diameter holes 9 are provided. The holes 9 penetrate the cooling stud 4 in the radial direction in the part of the cooling stud 4 which is positioned in the vessel 5. The rest of this second embodiment is the same as the first embodiment.

In the embodiment of this configuration, when the liquefied and cooled working fluid passes through the small diameter holes 9 formed in the cooling stud 4, this working fluid is vaporized and removes the heat from the cooling stud 4 and is thus able to effectively cool the semiconductor chip 1.

Third embodiment

Figure 9:
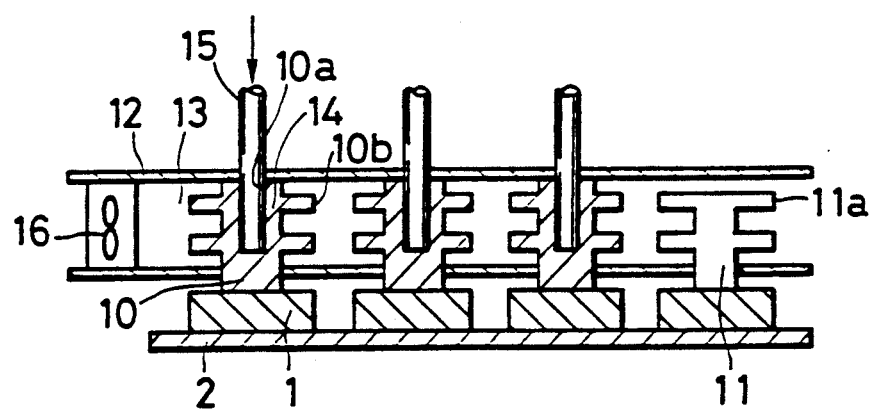
FIG. 9 is a schematic sectional view showing a cooling apparatus which relates to a third embodiment of the present invention.

FIG. 9 is a schematic sectional view showing a cooling apparatus which relates to a third embodiment of the present invention. As shown in the drawing, a plurality of semiconductor chips 1 (four in the drawing) are attached to the substrate 2, for example, through a bump or bonding wire (omitted from the drawings), and a pair of cooling studs 10, 11 are thermally joined to the upper surface of each semiconductor chip 1 respectively.

The cooling stud 10 is positioned within a channel 13 formed in a duct 12, and the end of the cooling stud 10 contacts the inside surface of the duct 12. The part of the cooling stud 10 positioned within the channel 13 is formed from a porous material (for example, a porous metal) 14, and a hole 10a is formed inside the cooling stud 10.

A pipe 15 connected to a condenser (omitted from the drawing) is set in the hole 10a of the cooling stud 10, and a liquefied and cooled working fluid (for example, a Freon alternative) passing through the pipe 15 from the liquificatin/cooling device is introduced into the cooling stud 10.

In addition, a fan 16 is positioned in the channel 13 to provide a flow of a fluid such as air in the channel 13. A plurality of fins 10b, 11a are also provided, these fins being formed respectively on the cooling studs 10, 11.

Because the cooling apparatus of the present embodiment has the configuration outlined above, when heat is generated in the semiconductor chip 1, this heat is transmitted to the cooling studs 10, 11 which are joined to the semiconductor chips 1.

At this time, a working fluid, which is liquefied and cooled by a condenser (omitted from the drawing), is introduced into the porous material 14 of the cooling stud 10 through the pipe 15, and this working fluid flows out into the channel 13 through the porous material 14. At this time, when the liquefied and cooled working fluid passes through the porous material 14, this working fluid is vaporized and removes the heat from the cooling stud 10 and is thus able to effectively cool the semiconductor chip 1.

In addition, the heat in the working fluid which is discharged into the channel 13 is released to atmosphere from the fluid flowing in the channel 13, by the fan 16. At this time, the coolant flowing out along the surface of the cooling stud 10 can be vaporized at high efficiency from the fluid flow in the channel 13 from the fan 16. Also, the heat transferred to the cooling stud 11 is radiated into the channel 13 through the fin 11a.

Fourth embodiment

Figure 10:
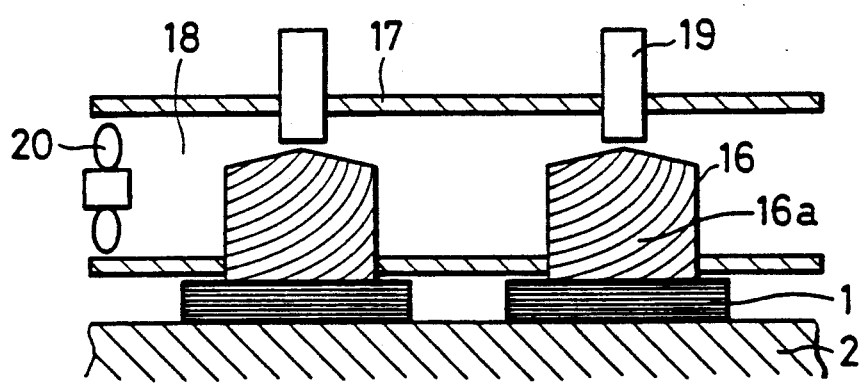
FIG. 10 is a schematic sectional view showing a cooling apparatus which relates to a fourth embodiment of the present invention.

FIG. 10 is a schematic sectional view showing a cooling apparatus which relates to a fourth embodiment of the present invention. As shown in the drawing, a plurality of semiconductor chips 1 (two in the drawing) is attached to the substrate 2, for example, through a bump or bonding wire (omitted from the drawings), and a cooling stud 16, on the upper surface of which are formed narrow grooves 16a, is thermally joined to the upper surface of each semiconductor chip 1.

The cooling stud 16 is positioned within a channel 18 formed in a duct 17, and a fluid supply device 19 for feeding various coolants, such as, for example, water, to the cooling stud 16 is positioned on the duct 17 at the center of the upper section of the cooling stud 16. In addition, the upper section of the cooling stud 16 and the grooves 16a are formed at a slant to provide a coolant over the entire periphery of the cooling stud 16.

Because the cooling apparatus of the present embodiment has the configuration outlined above, when heat is generated in the semiconductor chip 1, this heat is transmitted to the cooling studs 16 which are joined to the semiconductor chips 1.

At this time, a coolant from the fluid supply device 19 is fed to the cooling stud 16. The coolant is vaporized and spread over the entire surface of the cooling stud 16 by the grooves 16a, removing the heat from the cooling stud 16, and is thus able to effectively cool the semiconductor chip 1.

In addition, from the ventilation of the channel 13 by the fan 20, the coolant flowing out along the surface of the cooling stud 16 can be vaporized at high efficiency.

The coolant vaporized and discharged into the channel 18 is either discharged to the atmosphere or recovered in a recovery device. The amount of coolant fed onto the cooling stud 16 from the fluid supply device 19 is controlled to correspond to the amount of heat generated by the semiconductor chip 1.

Fifth embodiment

Figure 11:
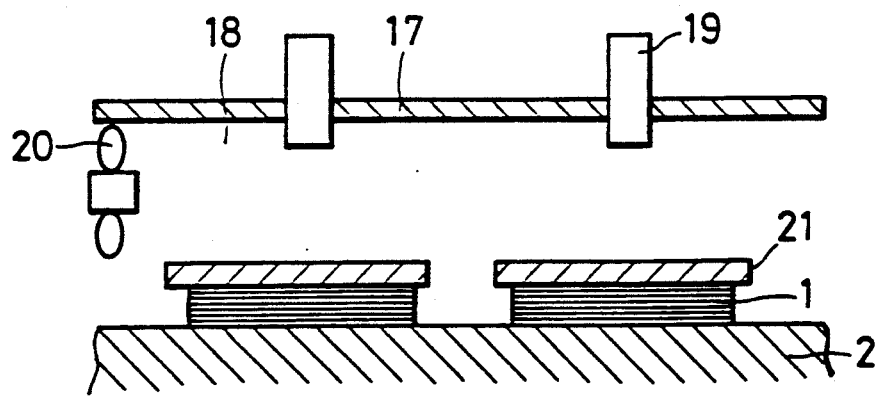
FIG. 11 is a schematic sectional view showing a cooling apparatus which relates to a fifth embodiment of the present invention.

FIG. 11 is a schematic sectional view showing a cooling apparatus which relates to a fifth embodiment of the present invention. In this embodiment, in place of the cooling stud 16 used in the fourth embodiment shown in FIG. 10, a porous metal 21 is thermally joined to the upper surface of each semiconductor chip 1. The rest of this second embodiment is the same as the fourth embodiment.

Also, in the embodiment of this configuration, by feeding a coolant such as, for example, water onto the porous metal 21 from the fluid supply device 19, the coolant vaporizes and completely covers all surfaces within the porous metal 21 by capillary pressure, removing the heat from the semiconductor chip 1 and is thus able to effectively cool the semiconductor chip 1.

In addition, in place of the porous metal 21, it is also possible to use, for example, a metallic fiber bonded member, a metal and fiber bonded member, or a nonwoven fabric, or the like.

Sixth embodiment

Figure 12:
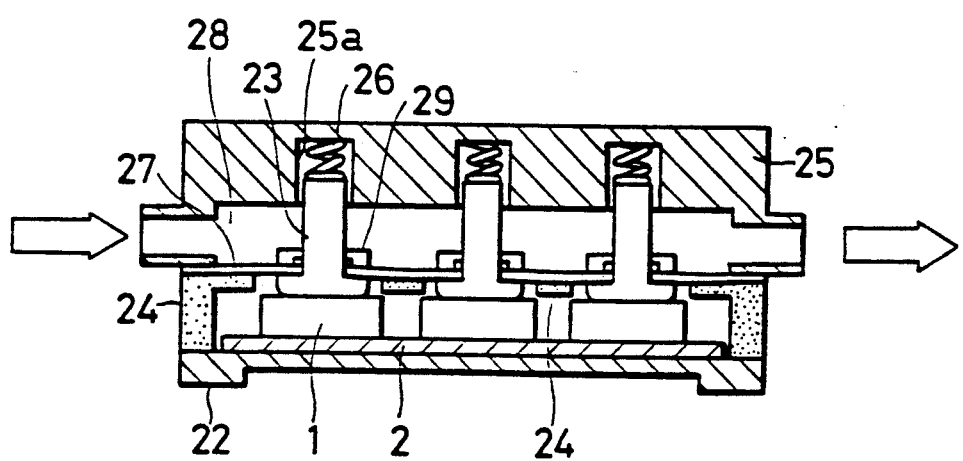
FIG. 12 is a schematic sectional view showing a cooling apparatus which relates to a sixth embodiment of the present invention.

FIG. 12 is a schematic sectional view showing a cooling apparatus which relates to a sixth embodiment of the present invention. As shown in the drawing, a plurality of semiconductor chips 1 (three in the drawing) are attached to the substrate 2 on a base 22, for example, through a bump or bonding wire (omitted from the drawings), and a cooling stud 23 is thermally joined to the upper surface of each semiconductor chip 1.

The cooling studs 23 are positioned within a channel block 25 set on the base 22 through a plate-shaped block 24. The upper section of each cooling stud 23 is set into a respective hole 25a formed in the channel block 25, and the cooling stud 23 is caused to press against the semiconductor chip 1 by a spring 26 provided in the hole 25a. A flexible sheet 27 is set between the block 24 and the channel block 25. The center section of each cooling stud 23 is positioned in a channel 28, formed between the channel block 25 and the sheet 27, in which a coolant such as, for example, water is flowing.

Figure 13:
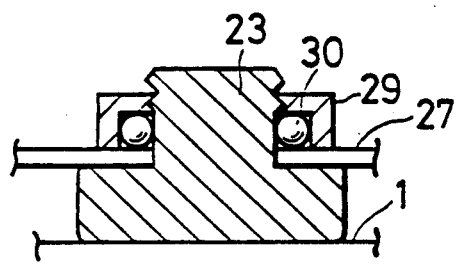
FIG. 13 is a partial sectional view of the cooling apparatus shown in FIG. 12.

The cooling studs 23 are formed from an upper section and a lower section with a larger diameter than the upper section. The sheet 27 is set on the upper surfaces of the lower sections of the cooling studs 23, and is interposed between the lower sections of the cooling studs 23 and a plurality of maintaining members 29, which are screwed onto the respective cooling studs 23. An O-ring 30 is provided in each maintaining member 29 (see FIG. 13). The O-rings 30 provide a seal between the sheet 27 and the cooling studs 23 so that the semiconductor chips 1 are not in contact with the coolant flowing in the channel 28. Between two adjacent cooling studs 23, the lower surface of the sheet 27 is supported on the plate-shaped block 24 to prevent breakage of the sheet 27, because the pressure of the coolant on the sheet 27 is downward. The sheet 27 is fabricated from a resin film or from a metal film.

Because the cooling apparatus of the present embodiment has the configuration outlined above, when heat is generated in the semiconductor chips 1, this heat is transmitted to the cooling studs 23 which contact the semiconductor chips 1. The heat which has been transmitted to the cooling studs 23 is then transmitted by direct heat transfer to the coolant 27 flowing in the channel 28, thus effectively cooling the semiconductor chips 1.

It is also possible to reduce the heat resistance by applying pressure by the spring 26 so that the cooling studs 23 are in intimate contact with the semiconductor chips 1.

Figure 14:
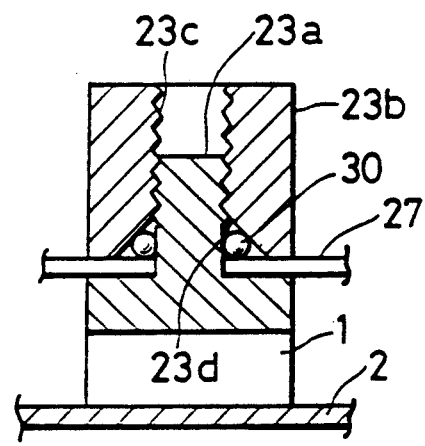
FIG. 14 is a partial sectional view of another modification relating to the cooling apparatus shown in FIG. 12.

The cooling studs 23 described above are integrally formed, but it is also possible to fabricate the cooling studs 23 with a different shape as illustrated in FIG. 14, comprising a first stud 23a provided on the semiconductor chip 1 and a second stud 23b positioned in the channel 28 and in the hole 25a in the channel block 25, with almost the same outer diameters. In this cooling stud 23, the first stud 23a which passes through the sheet 27 screws into a threaded hole 23c formed in the second stud 23b. The flexible sheet 27 is interposed between the first stud 23a and the second stud 23b.

An inclined section 23d is formed in the lower part of the hole 23c in the second stud 23b. The O-ring 30 is set in a space formed by the inclined section 23d and the first stud 23a to seal the contracted sheet 27. The outer diameter of the cooling stud 23 in this embodiment is formed to be almost the same size as, or slightly smaller than, the semiconductor chip 1.

Figure 15:
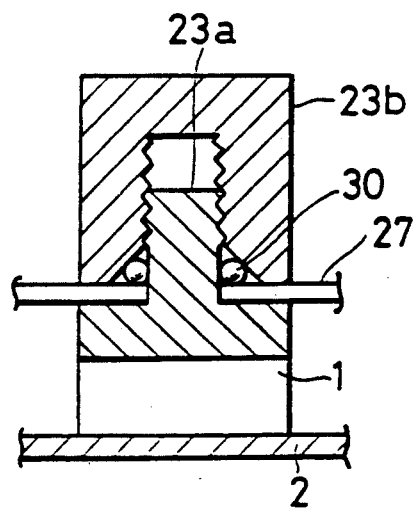
FIG. 15 is a partial sectional view of further another modification relating to the cooling apparatus shown in FIG. 12.

In this embodiment, the hole 23c in the second stud 23b of the cooling stud 23 penetrates through to the upper part of the second stud 23b, but, as shown in FIG. 15, it is also acceptable to have a cooling stud 23 in which the first stud 23a screws into the threaded hole 23c which does not penetrate as far as the upper part of the second stud 23b. Also, in the embodiment shown in FIG. 12, a thin metal plate with elastic characteristics may be used as the sheet 27. In this case, it is possible to improve the effectiveness of the seal by tightening the cooling stud 23 by means of the maintaining member 29 and then welding that part.

Seventh embodiment

Figure 16:
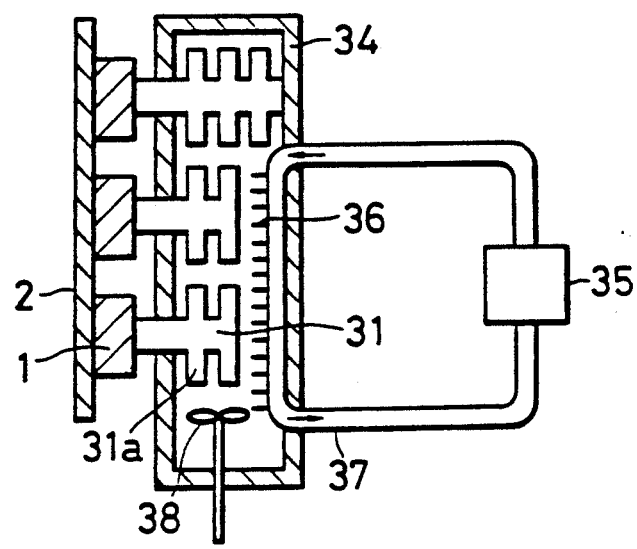
FIG. 16 is a schematic sectional view showing a cooling apparatus which relates to a seventh embodiment of the present invention.

FIG. 16 is a schematic sectional view showing a cooling apparatus which relates to a seventh embodiment of the present invention. As shown in the drawing, a plurality of semiconductor chips 1 (three in the drawing) are attached to the substrate 2, for example, through a bump or bonding wire (omitted from the drawings), and a cooling stud 31 on which is integrally formed a fin 31a is thermally joined to the upper surface of each semiconductor chip 1 respectively.

The cooling studs 31 are set in a vessel 34 which is filled with a coolant such as, for example, water, and sealed. A pipe 37 provided with a fin 36 connected to a heat exchanger 35, and an agitator 38 which stirs the coolant in the vessel 34 are installed inside the vessel 34.

Because the cooling apparatus of the present embodiment has the configuration outlined above, when heat is generated in the semiconductor chips 1, this heat is transmitted to the cooling studs 31 which are connected to the semiconductor chips 1. The heat which has been transmitted to the cooling studs 31 is then transmitted by direct heat transfer to the coolant in the vessel 34, thus effectively cooling the semiconductor chips 1.

At this time, the coolant which has been heated by heat exchange is cooled by heat exchange with a working fluid (for example, an alternative to Freon, such as a fluorocarbon) which is circulated in the pipe 37 connected to the heat exchanger 35, and is further agitated by the agitator 38 so that the semiconductor chips 1 can be cooled more effectively.

Eighth Embodiment

Figure 17:
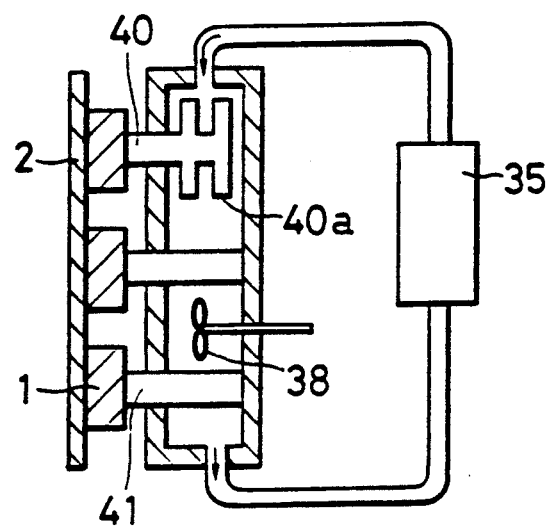
FIG. 17 is a schematic sectional view showing a cooling apparatus which relates to an eighth embodiment of the present invention.

FIG. 17 is a schematic sectional view showing a cooling apparatus which relates to an eighth embodiment of the present invention. In this embodiment, the coolant in the vessel 34 of the cooling apparatus is circulated through the pipe 37 to the heat exchanger 35 and back to the vessel 34 in the same manner as in the seventh embodiment shown in FIG. 16. The rest of the eighth embodiment is the same as the seventh embodiment. Also, a fin 40a is formed on a cooling stud 40 but no fin is formed on a cooling stud 41. Both these studs are connected to the semiconductor chip 1 and installed in the vessel 34.

Because the cooling apparatus of the present embodiment has the configuration outlined above, when heat is generated in the semiconductor chips 1, this heat is transmitted to the cooling studs 40, 41 which are connected to the semiconductor chips 1. The heat which has been transmitted to the cooling studs 40, 41 is then transmitted by direct heat transfer to the coolant in the vessel 34, thus effectively cooling the semiconductor chips 1.

At this time, the coolant which has been heated by heat exchange is cooled by circulation through the pipe 37 to the heat exchanger 35, and is further agitated by the agitator 38 so that the semiconductor chips 1 can be cooled more effectively.

Ninth Embodiment

Figure 18:
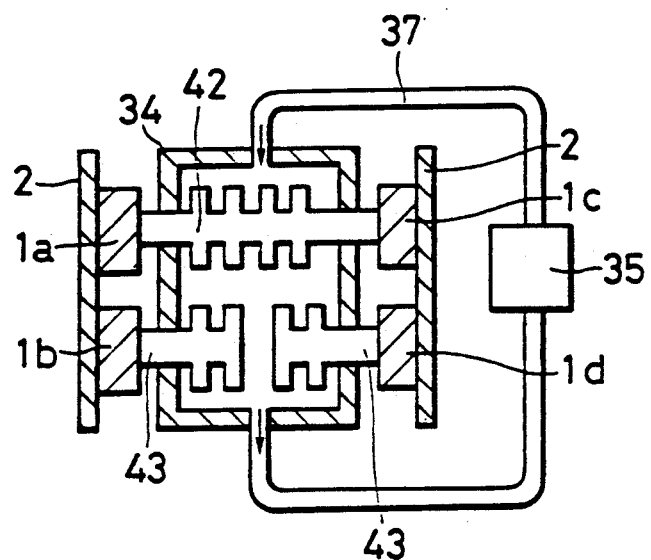
FIG. 18 is a schematic sectional view showing a cooling apparatus which relates to a ninth embodiment of the present invention.

FIG. 18 is a schematic sectional view showing a cooling apparatus which relates to a ninth embodiment of the present invention. In this embodiment, a plurality of semiconductor chips 1a, 1b, 1c, 1d (two one-sided chips in the drawing) are attached to a pair of bases 2 on two opposing sides of the vessel 34 (the left side and the right side in the drawing) filled with a coolant such as water, for example, through a bump or bonding wire (omitted from the drawings).

A cooling stud 42 extends between the opposedly positioned semiconductor chips 1a, 1c and connects those chips 1a, 1c, and a pair of independent cooling studs 43, 43 are thermally joined to the semiconductor chips 1b, 1d respectively. The cooling studs 42, 43 are set in the vessel 34 and sealed.

A pipe 37 connects the vessel 34 to the heat exchanger 35, and the coolant is circulated through the pipe 37 between the vessel 34 and the heat exchanger 35.

Because the cooling apparatus of the present embodiment has the configuration outlined above, when heat is generated in the semiconductor chips 1a, 1b, 1c, 1d, this heat is transmitted to the cooling studs 42, 43 which are connected to the semiconductor chips 1a, 1b, 1c, 1d. The heat which has been transmitted to the cooling studs 42, 43 is then transmitted by direct heat transfer to the coolant in the vessel 34, thus effectively cooling the semiconductor chips 1a, 1b, 1c, 1d installed on the two sides of the vessel 34, and saving space at the same time.

At this time, the coolant which has been heated by heat exchange is cooled by heat exchange by being circulated through the pipe 37 to the heat exchanger 35, so that the semiconductor chips 1 can be effectively cooled.

Tenth Embodiment

Figure 19:
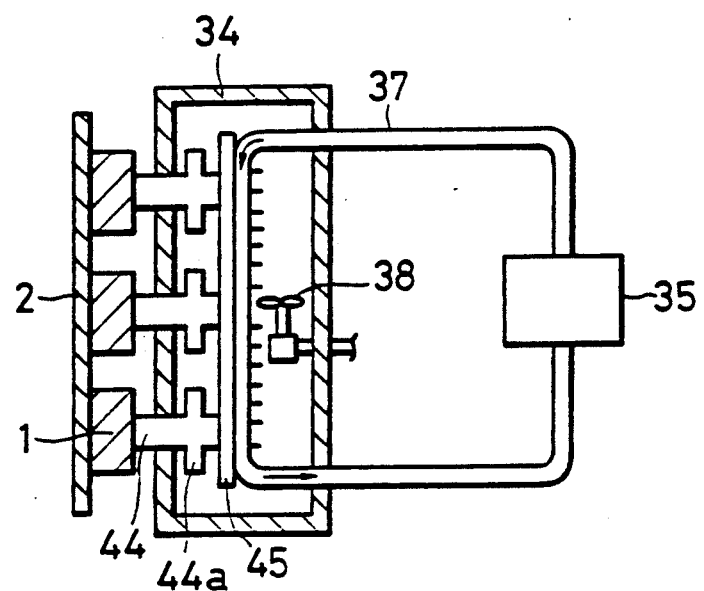
FIG. 19 is a schematic sectional view showing a cooling apparatus which relates to a tenth embodiment of the present invention.

FIG. 19 is a schematic sectional view showing a cooling apparatus which relates to a tenth embodiment o the present invention. In this embodiment, the vessel 34 is filled with a coolant such as, for example, water, while a plate-shaped rectifier plate 45 is provided, extending across the cooling studs 44, each of which is provided with a fin 44a. The heat exchanger 35 is connected to the pipe 37. In addition, the agitator 38 is installed at the side of the pipe 37 in the vessel 34, for circulating the coolant in the vessel 34 along the face of the rectifier plate 45. The rest of the tenth embodiment is the same as the seventh embodiment shown in FIG. 16.

Because the cooling apparatus of the present embodiment has the configuration outlined above, when heat is generated in the semiconductor chips 1, this heat is transmitted to the cooling studs 44. The heat which has been transmitted to the cooling studs 44 is then transmitted by direct heat transfer to the coolant in the vessel 34, thus effectively cooling the semiconductor chips 1.

At this time, the coolant which has been heated by heat exchange is cooled by heat exchange with a working fluid (for example, a Freon alternative, such as a fluorocarbon) which is circulated in the pipe 37 connected to the heat exchanger 35, and is further agitated by the agitator 38 parallel to the rectifier plate 45 in the vessel 34, so that the semiconductor chips 1 can be cooled more effectively.

Eleventh Embodiment

Figure 20:
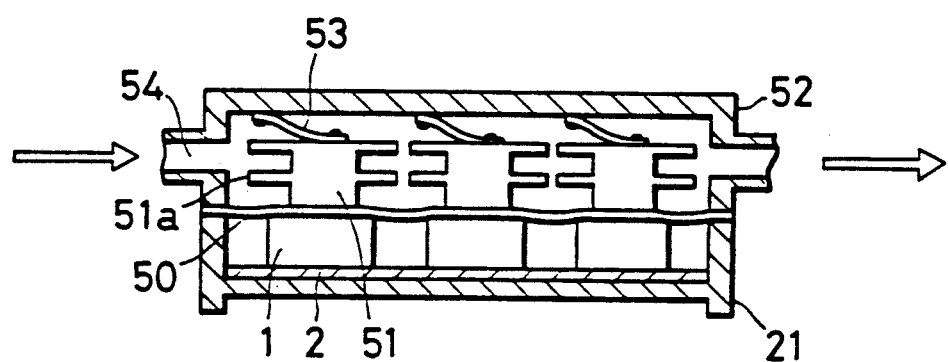
FIG. 20 is a schematic sectional view showing a cooling apparatus which relates to an eleventh embodiment of the present invention.

FIG. 20 is a schematic sectional view showing a cooling apparatus which relates to an eleventh embodiment of the present invention. As shown in the drawing, a plurality of semiconductor chips 1 (three in the drawing) are attached to the substrate 2 on a base 21, for example, through a bump or bonding wire (omitted from the drawings), and a cooling stud 51 on which is formed a fin 51a is thermally joined to the upper surface of each semiconductor chip 1 through a flexible sheet 50.

The cooling studs 51 are positioned within a channel block 52 installed on the base 21, and the cooling studs 41 are pressed against the semiconductor chips 1 through the sheet 50 by a plate spring 53 provided between the cooling studs 51 and the inner sides of the channel block 52. The two ends of the sheet 50 are interposed between the base 21 and the channel block 52, causing the sheet 50 to contract and forming a seal. A channel 54, in which a coolant flows, is formed between the channel block 52 and the sheet 50.

Because the cooling apparatus of the present embodiment has the configuration outlined above, when heat is generated in the semiconductor chips 1, this heat is transmitted to the cooling studs 51 which contact the semiconductor chips 1 through the sheet 50. The heat which has been transmitted to the cooling studs 51 is then transmitted by direct heat transfer to the coolant flowing in the channel 54, thus effectively cooling the semiconductor chips 1.

In addition, it is possible to reduce the heat resistance because the cooling studs 51 are in intimate contact with the semiconductor chips 1 through the flexible sheet 50.

Twelfth Embodiment

Figure 21:
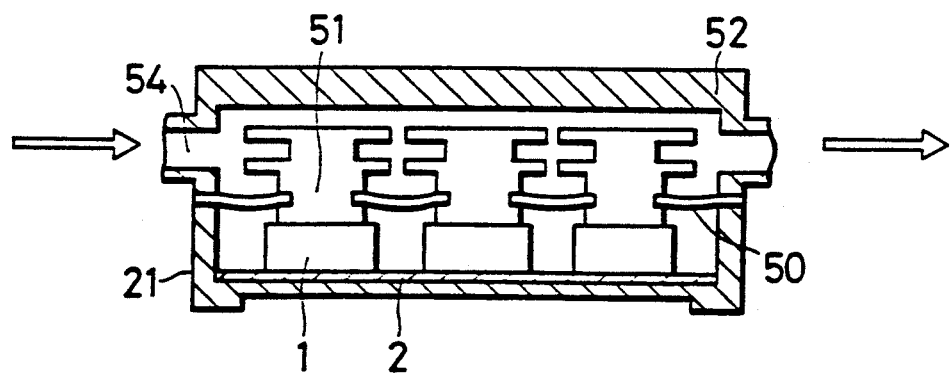
FIG. 21 is a schematic sectional view showing a cooling apparatus which relates to a twelfth embodiment of the present invention.

FIG. 21 is a schematic sectional view showing a cooling apparatus which relates to a twelfth embodiment of the present invention. This embodiment has a configuration wherein the flexible sheet 50 is sealed by contraction in a groove formed around the circumference at the lower side of each stud 51 connected to the top of each semiconductor chip 1 in the eleventh embodiment shown in FIG. 16. In addition, in the present embodiment, the cooling studs 51 are pressed against the semiconductor chips 1 by the pressure of a cooling liquid. Plate springs for pressing the cooling studs 51 are unnecessary. The balance of the structure is the same as the structure of the eleventh embodiment.

In this embodiment also, the heat transmitted to the cooling studs 51 from the semiconductor chips 1 is cooled by direct heat exchange with the coolant flowing in the channel 54, thus effectively cooling the semiconductor chips 1.

Thirteenth Embodiment

Figure 22:
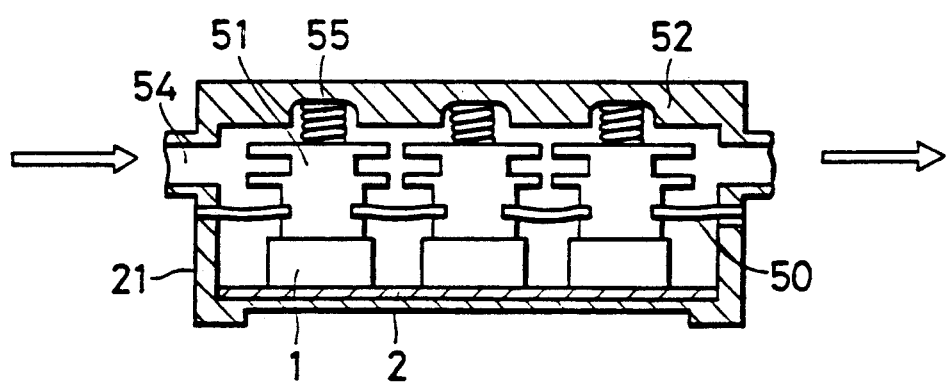
FIG. 22 is a schematic sectional view showing a cooling apparatus which relates to a thirteenth embodiment of the present invention.

FIG. 22 is a schematic sectional view showing a cooling apparatus which relates to a thirteenth embodiment of the present invention. This embodiment has a configuration wherein each cooling stud 51 is pressed onto a semiconductor chip 1 by a spring 55 installed between the inner surface of the channel block 52 and the upper surface of each cooling stud 51 in the twelfth embodiment shown in FIG. 21. In addition, in the present embodiment, because the cooling studs 51 are pressed against the semiconductor chips 1 by the pressure of the spring 55, the cooling studs 51 are set to contact the semiconductor chips 1 with even more pressure than in the twelfth embodiment. The balance of the structure is the same as the structure of the twelfth embodiment.

In this embodiment also the heat transmitted to the cooling studs 51 from the semiconductor chips 1 is cooled by direct heat exchange with the coolant flowing in the channel 54, thus effectively cooling the semiconductor chips 1.

In addition, it is possible to reduce the heat resistance because the cooling studs 51 intimately contact the semiconductor chips 1 through pressure exerted by the springs 55.

Fourteenth Embodiment

Figure 23:
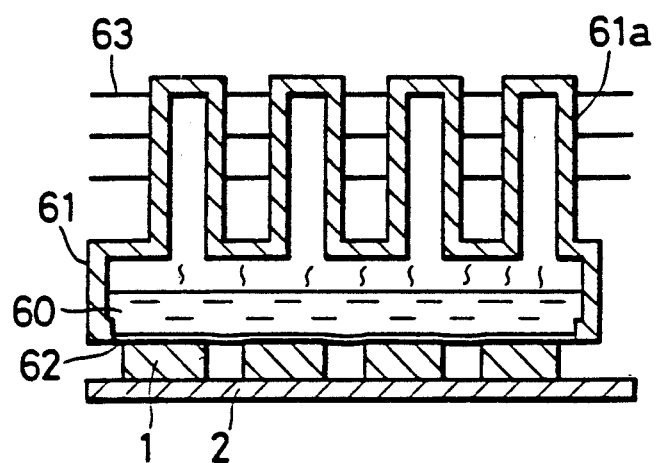
FIG. 23 is a schematic sectional view showing a cooling apparatus which relates to a fourteenth embodiment of the present invention.

FIG. 23 is a schematic sectional view showing a cooling apparatus which relates to a fourteenth embodiment of the present invention. As shown in the drawing, a plurality of semiconductor chips 1 (four in the drawing) is attached to the substrate 2, for example, through a bump or bonding wire (omitted from the drawings), and a cap 61 into which is sealed a working fluid 60 (for example, a Freon alternative) is mounted on the upper surface of each semiconductor chip 1. A flexible sheet 62 with good heat conductivity is set an sealed to the bottom surface of the cap 61 in contact with each of the semiconductor chips 1, and a plurality of pipes 61a are provided, each of the pipes 61a, on which a fin 63 is mounted, being integrally formed on the upper portion of the respective cap 61. The flexible sheet 62 is in contact with the semiconductor chips 1 even though the heights of the chips 1 differ from one another because the flexible sheet 62 can be flexibly bent.

Because the cooling apparatus of the present embodiment has the configuration outlined above, when heat is generated in the semiconductor chips 1, this heat is transmitted through the sheet 62 to a working fluid 60 in the cap 61. The working fluid 60 is then vaporized by the heat from the semiconductor chips 1, and the vaporized working fluid 60 rises in the pipes 61a. Because the pipes 61a are cooled by the fins 63, after the vapor of the working fluid 60 which has risen in the pipes 61a has given up its heat and condensed, the condensed vapor of the working fluid 60 flows down into the cap 61. This circulation of the working fluid 60 is repeated to provide continuous cooling.

Fifteenth Embodiment

Figure 24:
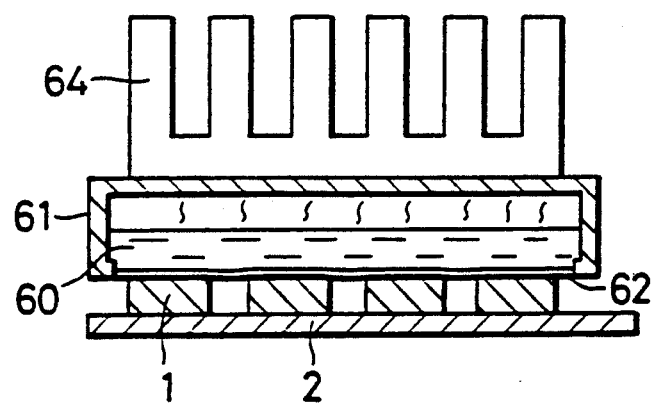
FIG. 24 is a schematic sectional view showing a cooling apparatus which relates to a fifteenth embodiment of the present invention.

FIG. 24 is a schematic sectional view showing a cooling apparatus which relates to a fifteenth embodiment of the present invention. In this embodiment, instead of forming the pipe 61a on the cap 61 as in the fourteenth embodiment shown in FIG. 23, a fin 64 is provided on the upper section of the cap 61. The balance of the structure is the same as the structure of the fourteenth embodiment.

In this embodiment also, when heat is generated in the semiconductor chips 1, this heat is transferred through the sheet 62 into the working fluid 60 in the cap in the same manner as in the fourteenth embodiment illustrated in FIG. 23.

The working fluid 60 is then vaporized by the heat from the semiconductor chips 1, and the vaporized working fluid 60 rises in the cap 61 to the upper portion.

Because the upper section of the cap 61 is cooled by the fin 64, after the vapor of the working fluid 60 which has risen to the upper portion of the cap 61 has given up its heat, it condenses and descends.

Sixteenth Embodiment

Figure 25:
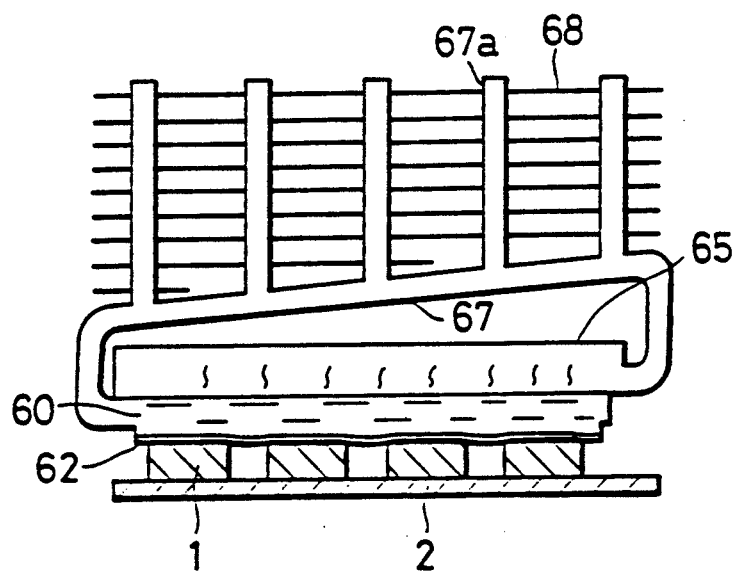
FIG. 25 is a schematic sectional view showing a cooling apparatus which relates to a sixteenth embodiment of the present invention.

FIG. 25 is a schematic sectional view showing a cooling apparatus which relates to a sixteenth embodiment of the present invention. As shown in the drawing, a plurality of semiconductor chips 1 (four in the drawing) is attached to the substrate 2, for example, through a bump or bonding wire (omitted from the drawings), and a cap 65 into which is sealed a working fluid 60 (for example, a Freon alternative) is mounted on the upper surface of each semiconductor chip 1. A flexible sheet 62 with good heat conductivity is provided on the bottom surface of the cap 65 in contact with each of the semiconductor chips 1 for sealing.

A slanting communicating vessel 67 is provided above the cap 65. One end of the communicating vessel 67 (the end at the top of the slanting section) communicates with the upper portion of one side surface of the cap 65. The other end of the communicating vessel 67 (the end at the bottom of the slanting section) communicates with the lower portion of the other side surface of the cap 65. Also, a plurality of hollow fin support columns 67a on which a plurality of fins 68 is mounted is integrally formed on the slanting portion of the communicating vessel 67.

Because the cooling apparatus of the present embodiment has the configuration outlined above, when heat is generated in the semiconductor chips 1, this heat is transmitted through the sheet 66 to a working fluid 60 in the cap 65. The working fluid 60 is then vaporized by the heat from the semiconductor chips 1, and the vaporized working fluid 60 rises in the fin support columns 67a through the communicating vessel 67. Because the fin support columns 67a are cooled by the fins 68, after the vapor of the working fluid 60 which has risen in the fin support columns 67a has given up its heat and condensed, it descends into the cap 65 through the communicating vessel 67.

Seventeenth embodiment

Figure 26:
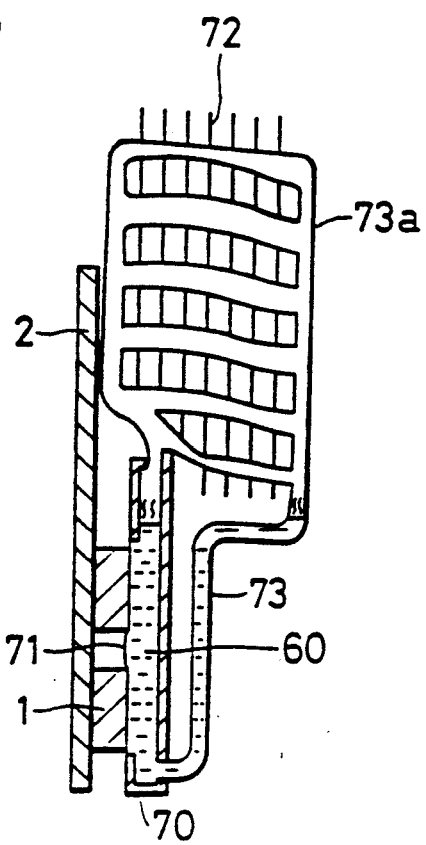
FIG. 26 is a schematic sectional view showing a cooling apparatus which relates to a seventeenth embodiment of the present invention.

FIG. 26 is a schematic sectional view showing a cooling apparatus which relates to a seventeenth embodiment of the present invention. As shown in the drawing, a plurality of semiconductor chips 1 (two in the drawing) is attached to the substrate 2, for example, through a bump or bonding wire (omitted from the drawings), and a cap 70 into which is sealed a working fluid 60 (for example, a Freon alternative) is mounted on the upper surface of each semiconductor chip 1. A flexible sheet 71 with good heat conductivity is provided on the surface of the cap 70 in contact with each of the semiconductor chips 1 for sealing.

Also, a communicating vessel 73, which is integrally formed with a hollow fin support column 73a on which a plurality of fins 72 are mounted, is connected in the longitudinal direction parallel to the cap 70. One end of the communicating vessel 73 communicates with the upper part of the cap 70 while the other end of the communicating vessel 73 communicates with the lower part of the cap 70.

Because the cooling apparatus of the present embodiment has the configuration outlined above, when heat is generated in the semiconductor chips 1, this heat is transmitted through the sheet 71 to a working fluid 60 in the cap 70. The working fluid 60 is then vaporized by the heat from the semiconductor chips 1, and the vaporized working fluid 60 rises in the fin support column 73a through the communicating vessel 73. Because the fin support columns 73a are cooled by the fins 72, after the vapor of the working fluid 60 which has risen in the fin support columns 73a has given up its heat and condensed, it returns to the cap 70 through the communicating vessel 73.

Eighteenth embodiment

Figure 27:
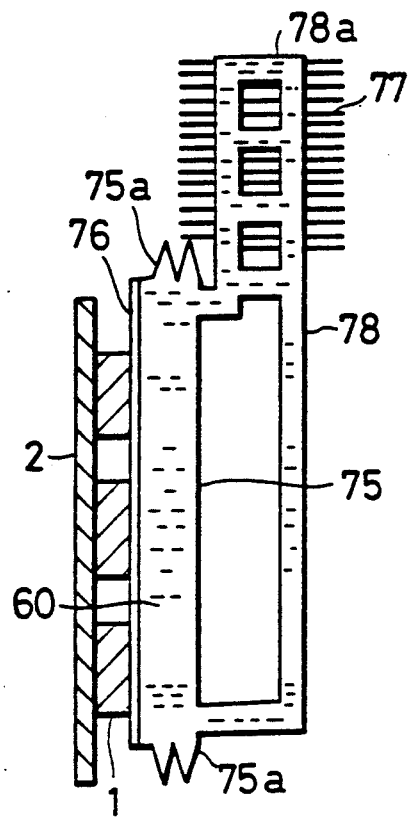
FIG. 27 is a schematic sectional view showing a cooling apparatus which relates to an eighteenth embodiment of the present invention.

FIG. 27 is a schematic sectional view showing a cooling apparatus which relates to an eighteenth embodiment of the present invention. As shown in the drawing, a plurality of semiconductor chips 1 (three in the drawing) is attached to the substrate 2, for example, through a bump or bonding wire (omitted from the drawings), and a cap 75 into which is sealed a working fluid 60 (for example, a Freon alternative) is mounted on the upper surface of each semiconductor chip 1. A flexible sealing sheet 76 with good heat conductivity is provided on the surface of the cap 75 in contact with each of the semiconductor chips 1.

Also, a communicating vessel 78, which is integrally formed with a hollow fin support column 78a on which a plurality of fins 77 are mounted, is connected in the longitudinal direction parallel to the cap 75. One end of the communicating vessel 78 communicates with the upper part of the cap 75. The other end of the communicating vessel 78 communicates with the lower part of the cap 75.

A bellows part 75a with elastic characteristics is formed on the two side surfaces of the cap 75 (the upper and lower surfaces in the longitudinal direction in the drawing), and when no heat is being generated in the semiconductor chips 1, the bellows part 75a contracts, causing the inner volume of the cap 75 to diminish so that the working fluid 60 completely fills the cap 75, the communicating vessel 78, and the fin support column 78a.

Because the cooling apparatus of the present embodiment has the configuration outlined above, when heat is generated in the semiconductor chips 1, this heat is transmitted through the sheet 76 to the working fluid 60 in the cap 75. When the heat from the semiconductor chips 1 is transmitted to the working fluid 60, the working fluid 60 is vaporized and, because of the rising pressure, the bellows part 75a is extended and the volume of the cap 75 expands (see FIG. 28).

When the volume of the cap 75 expands, the vaporized working fluid 60 rises in the fin support column 78a through the communicating vessel 78, because the surface of the working fluid 60 drops by the amount of the volume increase only.

The fin support column 78a is cooled by the fin 77 so that after the vapor of the working fluid 60 which has risen in the fin support columns 73a has given up its heat and condensed, it returns to the cap 75 through the communicating vessel 78.

Figure 28:
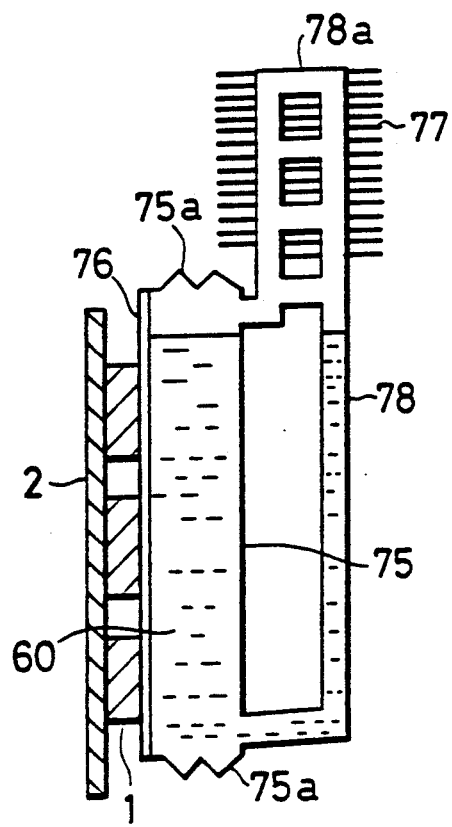
FIG. 28 is a schematic sectional view of the cooling apparatus shown in FIG. 27 when a bellows part is extended.

Therefore, when the heat generated in the semiconductor chips 1 is removed, the vaporization of the working fluid 60 halts, the pressure drops, and the bellows part 75a returns to its original state, and the working fluid 60 completely fills the cap 75, the communicating vessel 78, and the fin support column 78a (see FIG. 28).

Prior to filling the working fluid 60 into the cap 75, it is necessary to temporarily empty the cap 75, the communicating vessel 78, and the fin support column 78a to remove impure gases. Specifically, if any impure gases remain in the cap 75, the communicating vessel 78, or the fin support column 78a, the condensed surface of the working fluid 60 is reduced as a result of the impure gases, and there is a major reduction in the radiating efficiency of the fin support column 78a. However, with the present embodiment of the cooling apparatus, after the working fluid 60 is filled into the cap 75, the communicating vessel 78, and the fin support column 78a, mixing of the impure gases is prevented by sealing at a slightly elevated temperature, making it possible to improve the radiating efficiency.

Nineteenth embodiment

Figure 29:
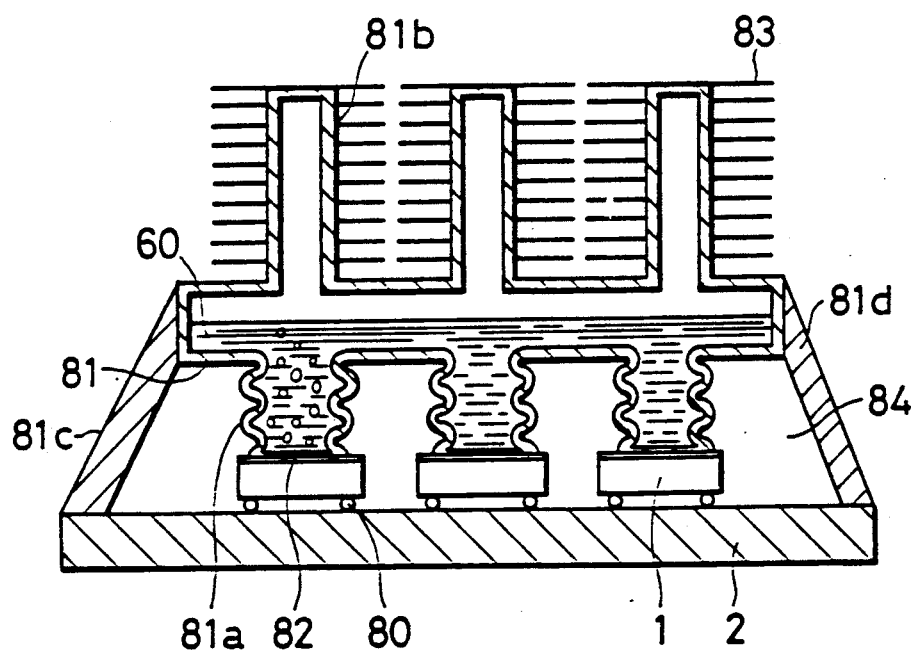
FIG. 29 is a schematic sectional view showing a cooling apparatus which relates to a nineteenth embodiment of the present invention.

FIG. 29 is a schematic sectional view showing a cooling apparatus which relates to a nineteenth embodiment of the present invention. As shown in the drawing, a plurality of semiconductor chips 1 (three in the drawing) is attached to the substrate 2, for example, through a bump or bonding wire (omitted from the drawings), and a cap 81 into which is sealed a working fluid 60 (for example, a Freon alternative) is mounted on the upper surface of each semiconductor chip 1.

A bellows part 81a with elastic characteristics is formed on the semiconductor chip 1 side of the cap 81, and a flexible sheet 82 with good heat conductivity is thermally connected between the bottom of the bellows part 81a and the semiconductor chip 1. In addition, a plurality of pipe sections 81b are provided. A fin 83 is mounted on each pipe section 81b integrally formed on the upper part of the cap 81.

The semiconductor chips 1 are formed as LSI modules by the provision of a space 84 formed between the side surfaces 81c, 81d of the cap 81 and the substrate 2. The space 84 is filled with an inert gas with good heat transmission capabilities, such as helium.

Because the cooling apparatus of the present embodiment has the configuration outlined above, when heat is generated in the semiconductor chips 1, this heat is transmitted through a sheet 82 to the working fluid 60 in the cap 81. When the heat from the semiconductor chips 1 is transmitted to the working fluid 60, the working fluid 60 is vaporized and, rises into the pipe sections 81b. The pipe sections 81b are cooled by the respective fins 83 so that, after the vaporized working fluid 60 which has risen into the pipe sections 81b has given up its heat, this vapor is condensed and drops back into the cap 81.

In addition, part of the heat in the semiconductor chips 1 is cooled by being transmitted into the cap 81 through the inert gas with good heat transmission capabilities, such as helium.

In the embodiment with this configuration, the pressure exerted on the semiconductor chips 1 can be applied uniformly by adjusting the bellows section 81a of the cap 81 so that the semiconductor chips 1 maintain good, intimate contact with the bottom surface of the bellows section 81a of the cap 81, thus lowering the thermal resistance.

Also, in this embodiment, the return of the condensed working fluid 60 into the cap 81 can be facilitated by proving a wick on the inner wall of the pipe section 81b of the cap 81.

In the present embodiment, it is also easy to initiate ebullition by the provision of minute irregularities on the bottom surface of the bellows section 81a of the cap 81. The provision of grooves to expand the heat transfer surface area on the inside walls of the pipe section 81b of the cap 81 can also further the heat transfer of the vapor of the working fluid 60 to the pipe section 81b.

Twentieth embodiment

Figure 30:
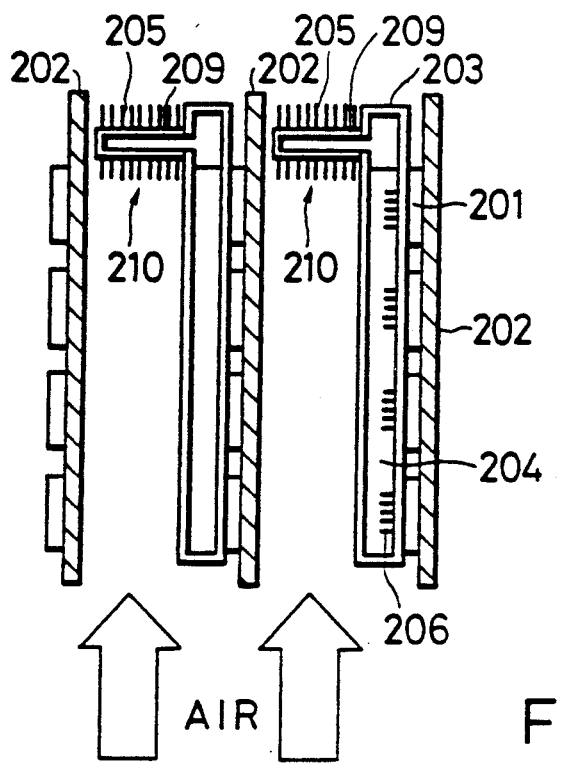
FIG. 30 is a schematic sectional view showing a cooling apparatus which relates to a twentieth embodiment of the present invention.

FIG. 30 is a schematic sectional view showing a cooling apparatus which relates to a twentieth embodiment of the present invention.

A semiconductor element 201 is set on a substrate 202. Heat generated by the semiconductor element 201 is transmitted into a working fluid 204 in a hollow vessel 203 and is then transferred to a plurality of fins 205 as the result of a phase change in the working fluid 204 (for example, liquid to vapor) and dissipated into the atmosphere.

Figure 31:
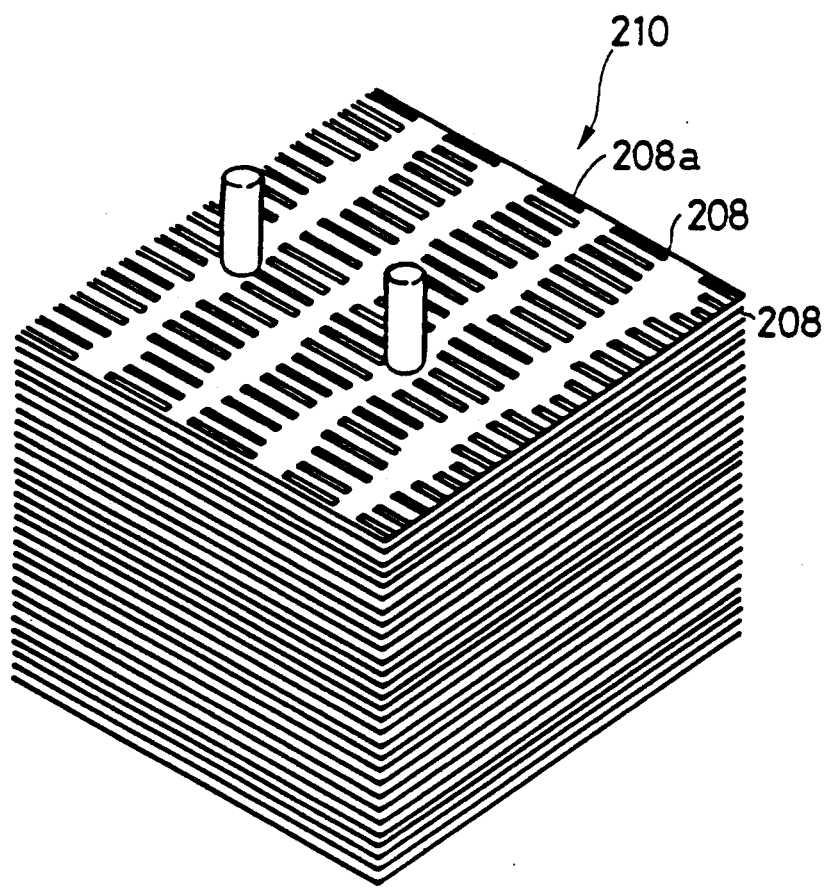
FIG. 31 is a diagonal view of a fin-tube heat exchanger of the cooling apparatus shown in FIG. 30.
Figure 32:
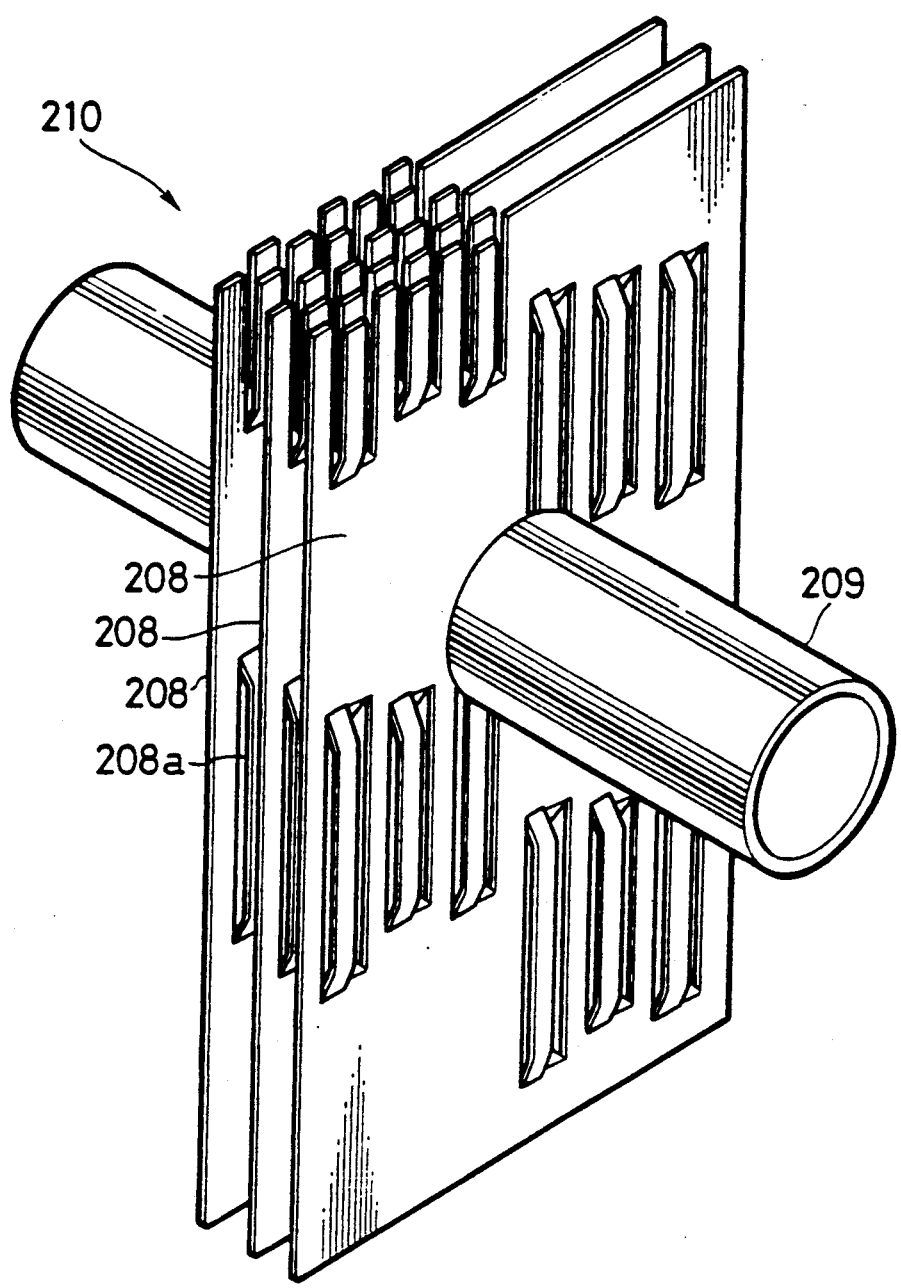
FIG. 32 is an enlarged diagonal view of fins of the heat exchanger shown in FIG. 31.

A first feature of the cooling apparatus of the present invention is the shape of the fins 205. FIGS. 31, 32 are a schematic perspective diagram and a partial expanded view respectively of the fins 205. The fins 205 are formed from a thin plate-shaped foil member 208 made up of multiple laminations of, for example, aluminum (aluminum foil). In addition, a plurality of slots 208a are formed in the individual sheets of the foil member 208 with the object of improving the heat radiating efficiency. The slots 208a are formed specifically with the object increasing the heat radiating area, shown in FIG. 32. In detail, a pair of arch-shaped protrusions is provided on each slot 208a to form a heat dissipation promoting element. One arch-shaped protrusion is protruded on one side of the fin 205, and the other arch-shaped protrusion is protruded on the other side of the fin 205. Therefore, when a cooling vapor passes over the fins 205, the cooling vapor passes under the arch-shaped protrusions while releasing the heat transmitted to the fins 205.

Specifically, this type of device formed from a hollow tube to which the fins 205 are thermally joined is known as a fin-tube heat exchanger. The fin-tube heat exchanger 210 is identical to a heat exchanger used on air conditioning equipment. In the present invention, the tube 209, on which the fins 205 are integrally installed by a thermal method to provide the fin-tube heat exchanger 210, serves as one part of a heat pipe and is secured to the hollow vessel 203 in a manner allowing communication between the two so that the working fluid 204 can freely enter the tube 209.

The fins 205 of the cooling apparatus of the present invention, as explained above, are thin fins in which are formed a plurality of slots, providing high performance through an extremely high radiating efficiency.

Specifically, the direction in which a cooling vapor, such as air, passes over the fins 205 shown in FIG. 30 is almost parallel to the substrates 202 on which the semiconductor elements 201 are mounted. The space formed between substrates 202 is aligned to create a duct-like slot which is utilized as a cooling fluid channel 207. Because the fins 205 of the present invention are concentrated and arranged in the duct-shaped cooling fluid channel 207, the cooling fluid contacts the fins 205 with high efficiency.

In this way, high cooling efficiency is obtained in the cooling apparatus on which the fins 205 are mounted by utilizing the essentially flush substrate 202 as a duct wall in the space between the like substrates 202.

In addition, a plurality of minute ebullition-promoting fins 206 may also be formed on the inner surface of a heat absorbing section in the hollow vessel 203 to expand the heat absorbing area and further improve the cooling efficiency.

Twenty first embodiment

Figure 33:
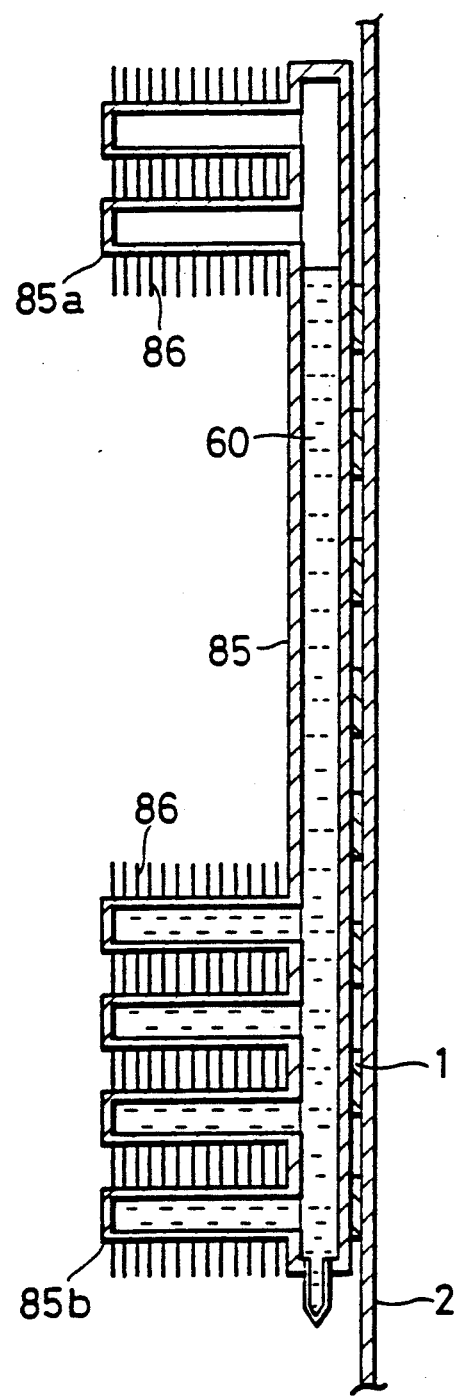
FIG. 33 is a schematic sectional view showing a cooling apparatus which relates to a twenty first embodiment of the present invention.

FIG. 33 is a schematic sectional view showing a cooling apparatus which relates to a twenty first embodiment of the present invention. As shown in the drawing, a plurality of semiconductor chips 1 (eight in the drawing) is attached to the substrate 2, for example, through a bump or bonding wire (omitted from the drawings), and a cap 85 into which is sealed a working fluid 60 (for example, a Freon alternative) is mounted on the upper surface of each semiconductor chip 1.

A plurality of fins 86 are integrally formed on a plurality of pipe sections 85a and also on plurality of pipe sections 85b, respectively mounted on an upper section and on a lower section of the side of the cap 85 opposite from the semiconductor chips 1.

Figure 34:
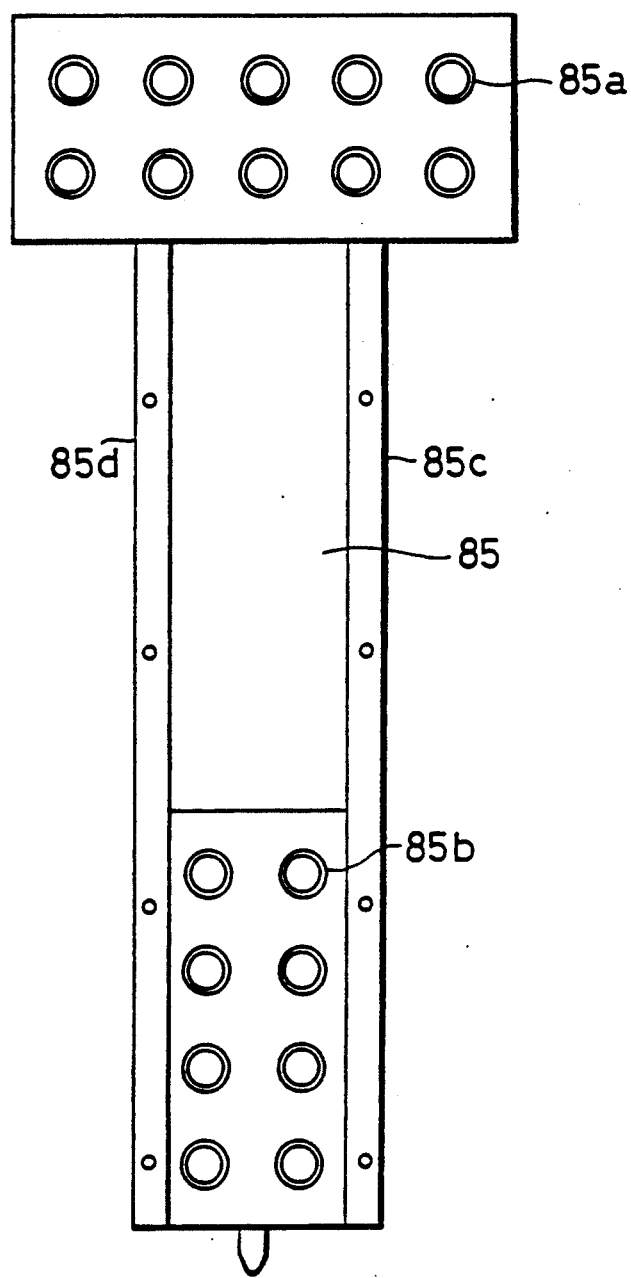
FIG. 34 is a schematic plan view of the cooling apparatus shown in FIG. 33.

Also, as shown in FIG. 34, by clamping a pair of clamping sections 85c, 85d, provided respectively on the two side sections of the cap 85, at a suitable pressure against the substrate 2, good thermal contact can be maintained between the semiconductor chips 1 and the substrate 2.

Because the cooling apparatus of the present embodiment has the configuration outlined above, when heat is generated in the semiconductor chips 1, this heat is transmitted to the working fluid 60 in the cap 85. When the heat from the semiconductor chips 1 is transmitted to the working fluid 60, the working fluid 60 is vaporized and rises in the pipe sections 85a on the upper section of the cap 85. After the pipe sections 85a are cooled by the fins 86, the vaporized working fluid 60 which has risen in the pipe sections 85a gives up its heat, condenses and flows back into the cap 85.

The heat in the semiconductor chips 1 which is transmitted to the working fluid 60 in the pipe sections 85b on the lower section of the cap 85 is radiated to the exterior from the fins 86. In the present embodiment, as compared with the cooling apparatus of the twentieth embodiment, good cooling can be obtained with almost uniform temperature distribution throughout each of the longitudinally-mounted semiconductor chips 1 by heat exchange with the fin-equipped pipe sections 85a, 85b on the upper and lower sections of the cap 85.

In this manner, in the fourteenth to twenty first embodiments, the heat from the semiconductor chips 1 can be transmitted at low thermal resistance, thus effectively cooling the semiconductor chips 1 from the principle of the heat pipe.

In addition, in the fourteenth to nineteenth embodiments, because the flexible sheets 62, 71, 76, 82 with good heat conductivity are in intimate contact with the semiconductor sheets 1, the heat from the semiconductor chips 1 can be transmitted to the working fluid 60 at low thermal resistance.

Further, in the fourteenth to nineteenth embodiments, because sheets with superior flexibility and electrical insulation are thermally connected to the semiconductor chips 1, an electrical connection is unnecessary. Accordingly, there are no adverse effects in the operation of the semiconductor chips 1.

Twenty second embodiment

Figure 35:
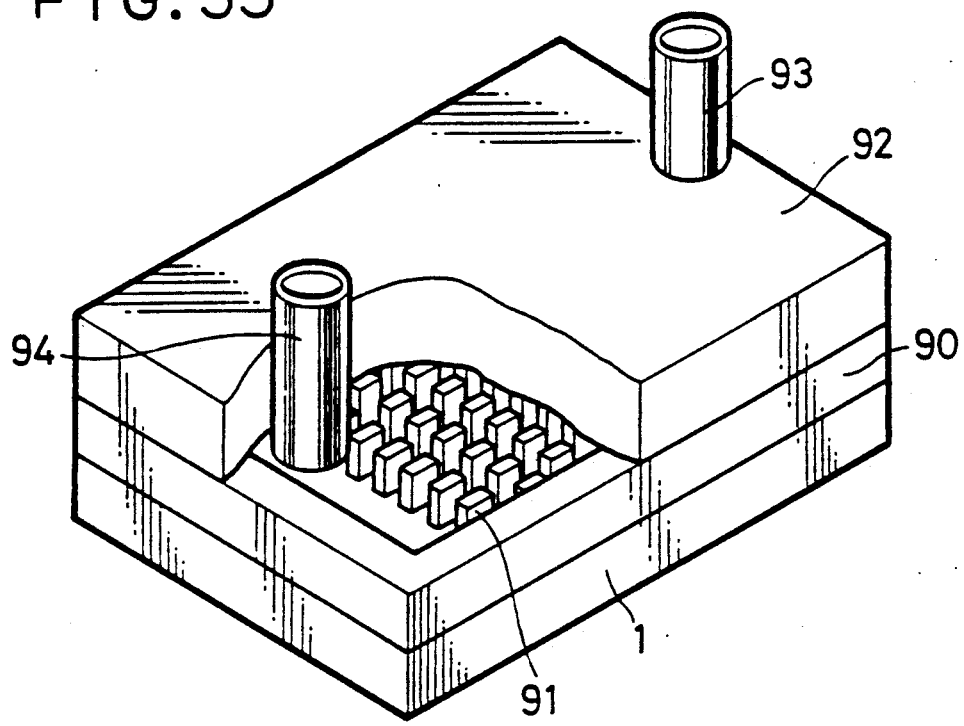
FIG. 35 is a schematic partial sectional view showing a cooling apparatus which relates to a twenty second embodiment of the present invention.
Figure 36:
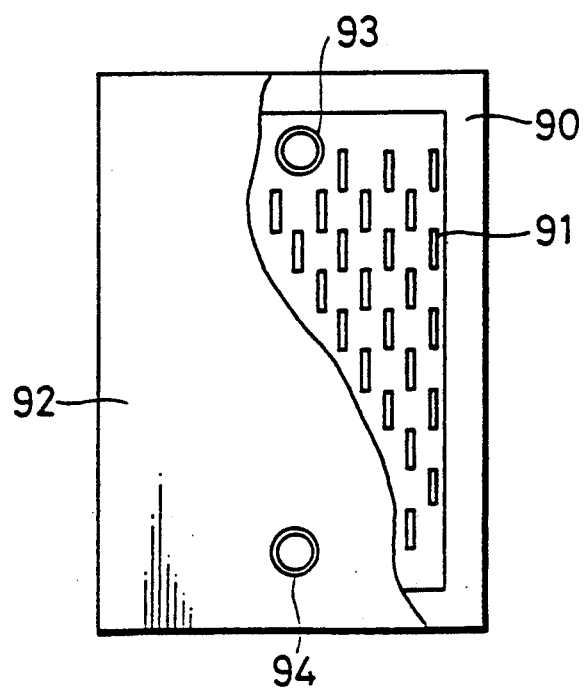
FIG. 36 is a partial sectional plan view of the cooling apparatus shown in FIG. 35.

FIG. 35 is a schematic sectional view showing a cooling apparatus which relates to a twenty second embodiment of the present invention. As shown in the drawing, a heat transmitting block 90 is thermally connected over the entire inside surface (the uppermost surface in the drawing) of the semiconductor chip 1. A plurality of very small fins 91 is formed in a staggered arrangement by an etching process on the surface of the heat transmitting block 90 opposite to the semiconductor chip 1 (see FIG. 36).

A cover plate 92 is set on the heat transmitting block 90 and sealed to cover the fins 91 on the peripheral surface of the heat transmitting block 90. In addition, a supply pipe 93 for supplying a coolant such as water to the fins 91, and a discharge pipe 94 for discharging the coolant are respectively positioned on the center line of the heat transmitting block 90 on two sides (the upper and lower sides in the drawing) of the fins 91 in the heat transmitting block 90.

Because the cooling apparatus of the present embodiment has the configuration outlined above, when heat is generated in the semiconductor chips 1, this heat is transmitted to the fins 91 in the heat transmitting block 90. Then, coolant is fed from the supply pipe 93 into in the heat transmitting block 90 on which the fins 91 are formed to remove the heat from the fins 91. The heated coolant is then discharged through the discharge pipe 94, thus effectively cooling the semiconductor chips 1.

In addition, by the staggered arrangement of the fins 91 in the heat transmitting block 90, the number of fins in each row is kept small and the resistance of the fins 91 to the flow of the cooling water in the channel is reduced.

Figure 37:
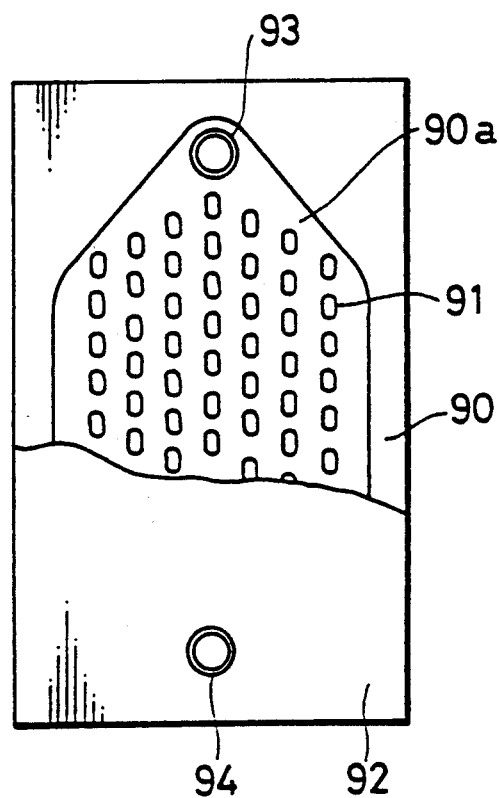
FIG. 37 is a partial sectional plan view showing a modification of the cooling apparatus shown in FIG. 35.

FIG. 37 is a partial sectional plan view showing a modification of this embodiment of the cooling apparatus of the present invention. In this modification, an inner wall surface 90a on the sides (the upper and lower sides in the drawing) on which the supply pipe 93 and the discharge pipe 94 are installed for supplying and discharging the cooling water to the fins 91 in the heat transmitting block 90, is inclined in the direction of flow from the supply pipe 93 to the discharge pipe 94, and the fins 91 also are formed to correspond to the shape of the inner wall surface 90a. The rest of the configuration is the same as the twenty second embodiment shown in FIG. 34, 35.

In this embodiment, as in the previous embodiment, the cooling water following the inner wall surface 90a of the heat transmitting block 90 flows with little resistance between the fins 91, thus effectively cooling the semiconductor chips 1.

The above-described embodiments of the cooling apparatus of the present invention are particularly effective when used with heat generating elements requiring large amounts of electric power.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A cooling apparatus for cooling a heat generating member by removing heat produced in the member, comprising:
    a cooling stud formed from a porous material which is thermally jointed to the heat generating member and is provided with a longitudinal internal hole and a large number of pores penetrating from the longitudinal internal hole to the periphery surface thereof;
    a working fluid for removing the heat transmitted to the cooling stud by utilizing vaporization thereof;
    a fluid supplier for providing the working fluid in a liquid phase to the longitudinal internal hole of the cooling stud, the working fluid in the liquid phase passing through the pores while vaporizing; and
    a gas supplier for supplying a gas on the periphery surface of the cooling stud to promote the vaporization of the working fluid, the working fluid vaporized on the periphery surface of the cooling stud being carrying away with the gas.

2. An apparatus according to claim 1 in which the cooling stud further includes fins for promoting the release of the heat in the working fluid, a part of the heat in the working fluid being transmitted to the fins.

3. An apparatus according to claim 1 in which the porous material is formed from a porous metal.

4. A cooling apparatus for cooling a heat generating member by removing heat produced in the member, comprising:
    a cooling stud which is thermally jointed to the heat generating member;
    a coolant for removing the heat transmitted to the cooling stud by convection cooling;
    a coolant supplier for supplying the coolant to the cooling stud;
    a flexible sheet for isolating the coolant from the heat generating member;
    a sheet pressing member screwed to the cooling stud for pressing the sheet against the cooling stud, the flexible sheet being interposed between the sheet pressing member and the cooling stud; and
    an O-ring for providing a seal between the flexible sheet and the cooling stud to further the isolation of the coolant from the heat generating member, the O-ring being pressed against the cooling stud by the sheet pressing member.

5. A cooling apparatus for cooling a plurality of heat generating members put side by side to one another by removing heat produced in the members, comprising:
    a working fluid for absorbing the heat produced in the members and vaporizing;
    a flexible heat transmitting sheet with good heat conductivity for transmitting therethrough the heat produced in the heat generating members to the working fluid, the sheet being in contact with entire surfaces of the heat generating members by flexibly bending the sheet;
    a cap type of fluid holder mounted on the flexible heat transmitting sheet for holding the working fluid in cooperation with the flexible heat transmitting sheet, the working fluid being vaporized in the fluid holder after the working fluid absorbs the heat through the heat transmitting sheet;
    a pipe section in which the working fluid vaporized in the fluid holder rises; and
    a heat dissipation section for dissipating the heat held in the vaporized fluid which rises in the pipe section, the vaporized fluid being condensed after the heat is dissipated in the heat dissipation section.

6. An apparatus according to claim 5 in which the heat dissipation section comprises a fin integrally formed on the pipe section.

7. An apparatus according to claim 5 in which the fluid holder includes:
    a vapor passage through which the vaporized fluid passes before rising in the pipe section; and
    a liquid returning passage through which the fluid condensed in the heat dissipation section passes to return to the fluid holder.

8. An apparatus according to claim 5 in which the fluid holder is substantially vertically positioned.

9. An apparatus according to claim 5 in which the fluid holder includes a bellows part for adjusting the volume of the fluid holder, the bellows part contracting to diminish the volume thereof when no heat is produced in the heat generating member and extending to increase the volume thereof when the heat is produced in the heat generating member.

10. A cooling apparatus for cooling a heat generating member by removing heat produced in the member, comprising:
    a cooling medium for absorbing the heat produced in the member;
    a plurality of hollow tubes for holding the cooling medium therein;
    a plurality of plate-shaped foil members thermally jointed to the hollow tubes for dissipating the heat transmitted from the cooling medium through the tube hollows, a plurality of heat dissipation promoting elements respectively formed from an arch-shaped protrusion being provided on the surface of the foil members and being thermally jointed to the foil members; and
    a cooling gas for releasing the heat transmitted to the plate-shaped foil members, the cooling gas passing over the foil members while passing under the heat dissipation promoting elements.

11. A cooling apparatus for cooling a plurality of heat generating members arranged in a vertical direction by removing heat produced in the member, comprising:
    a working fluid for absorbing the heat produced in the members and vaporizing;
    a vertical fluid holder thermally jointed to the heat generating members for holding the working fluid;
    a first fin-tube heat exchanger mounted on an upper section of the fluid holder for removing the heat of the fluid which has vaporized in the fluid holder by absorbing the heat produced in the heat generating members; and a second fin-tube heat exchanger mounted on a lower section of the fluid holder for removing the heat of the liquid phase fluid which has been warmed in the fluid holder.

12. A cooling apparatus for cooling a heat generating member by removing heat produced in the member, comprising:
   a cooling stud which is thermally jointed to the heat generating member and is provided with narrow grooves formed at a slant on the entire periphery thereof;
   a working fluid for removing the heat transmitted to the cooling stud by utilizing vaporization thereof;
   a fluid supplier for providing the working fluid in a liquid phase to the periphery of the cooling stud, the working fluid in the liquid phase streaming into the narrow grooves on the entire periphery of the cooling stud while being vaporized; and
   a gas supplier for supplying a gas on the periphery of the cooling stud to promote the vaporization of the working fluid, the working fluid vaporized on the periphery of the cooling stud being carrying away with the gas.

13. An apparatus according to claim 12 in which the cooling stud is a thin plate-shaped porous metal.

14. An apparatus according to claim 13 in which the porous metal is a sintered metal or a foamed metal.

15. An apparatus according to claim 1 in which the working fluid provided to the longitudinal internal hole is pressurized by the fluid supplier, the working fluid being depressurized when the working fluid passes through the pores.

* * * * *